United States Patent [19]
Suzuki et al.

[11] Patent Number: 5,679,485
[45] Date of Patent: Oct. 21, 1997

[54] PHOTOSENSITIVE COMPOSITION, PHOTOSENSITIVE RUBBER PLATE AND PROCESS FOR PRODUCING SAME, AND FLEXOGRAPHIC PLATE AND PROCESS FOR PRODUCING SAME

[75] Inventors: Takao Suzuki, Narashino; Fusayoshi Sakurai, Yokohama; Haruo Ueno, Tokyo; Ichiro Konishi; Tatsuo Usui, both of Yokohama, all of Japan

[73] Assignee: Nippon Zeon Co., Ltd., Tokyo, Japan

[21] Appl. No.: 525,743

[22] PCT Filed: Mar. 31, 1994

[86] PCT No.: PCT/JP94/00543

§ 371 Date: Sep. 29, 1995

§ 102(e) Date: Sep. 29, 1995

[87] PCT Pub. No.: WO94/23342

PCT Pub. Date: Oct. 13, 1994

[30] Foreign Application Priority Data

Mar. 31, 1993 [JP] Japan .................. 5-097026
Mar. 31, 1993 [JP] Japan .................. 5-097147
May 11, 1993 [JP] Japan .................. 5-132911

[51] Int. Cl.$^6$ .................. G03F 7/033; G03F 7/09; G03F 7/30
[52] U.S. Cl. .................. 430/18; 430/285.1; 430/287.1; 430/286.1; 430/910; 430/306; 430/907; 430/273.1; 522/109
[58] Field of Search .................. 430/285.1, 287.1, 430/286.1, 910, 907, 306, 273.1, 18; 522/109

[56] References Cited

U.S. PATENT DOCUMENTS

| | | | |
|---|---|---|---|
| 4,177,074 | 12/1979 | Proskow | 430/286.1 |
| 4,275,142 | 6/1981 | Hosaka et al. | 430/271.1 |
| 5,135,827 | 8/1992 | Bohm et al. | 430/286.1 |
| 5,240,808 | 8/1993 | Aoshima et al. | 430/285.1 |

FOREIGN PATENT DOCUMENTS

| | | | |
|---|---|---|---|
| 65285 | 11/1982 | European Pat. Off. | 430/285 |
| A-164270 | 11/1985 | European Pat. Off. | |
| 489553A1 | 6/1992 | European Pat. Off. | 430/286.1 |
| A-62-138845 | 6/1987 | Japan | |
| A-2-7055 | 1/1990 | Japan | |
| A-3-15071 | 1/1991 | Japan | |
| A-4-67041 | 3/1992 | Japan | |
| A-4-245249 | 9/1992 | Japan | |
| A-5-245249 | 9/1992 | Japan | |
| A-5-232698 | 9/1993 | Japan | |

OTHER PUBLICATIONS

No. 11027 "Phosphorus photocrosslinkable polymers", *Research Disclosure*, Jun. 1973, pp. 72–80.

*Primary Examiner*—Cynthia Hamilton
*Attorney, Agent, or Firm*—Armstrong, Westerman, Hattori, McLeland & Naughton

[57] ABSTRACT

A photosensitive composition comprising:

(A) 35–80 weight parts of a phosphorus-containing hydrophilic copolymer made by copolymerization of a mixture of (a) 5–30 weight % of a phosphate ester group-containing unsaturated monomer, (b) 40–90 weight % of a conjugated diene monomer, and (c) 0–50 weight % of other monoolefinically unsaturated monomer;

(B) 65–20 weight parts of a thermoplastic elastomer; the sum of (A) plus (B) being 100 weight parts;

(C) 5–300 weight parts of a photopolymerizable ethylenically unsaturated monomer; and (D) 0.1–10 weight parts of a photopolymerization initiator.

The photosensitive composition is useful for a photosensitive rubber plate and a flexographic printing plate.

20 Claims, No Drawings

PHOTOSENSITIVE COMPOSITION, PHOTOSENSITIVE RUBBER PLATE AND PROCESS FOR PRODUCING SAME, AND FLEXOGRAPHIC PLATE AND PROCESS FOR PRODUCING SAME

TECHNICAL FIELD

This invention relates to a photosensitive composition, a photosensitive rubber plate and a process for making the photosensitive rubber plate, and a flexographic printing plate and a process for making the flexographic printing plate. More particularly, this invention relates to (a) a photosensitive composition comprising a phosphorus-containing hydrophilic copolymer and a thermoplastic elastomer, (b) a photosensitive rubber plate which is a laminated product of the photosensitive composition on a support, (c) a flexographic printing plate comprising the rubber plate, and (d) processes for making the rubber plate and the flexographic printing plate.

BACKGROUND ART

As a printing material for flexographic printing, there are known (i) a cast rubber plate made by a process wherein a thermosetting resin is hot-pressed onto an original plate prepared, for example, by etching a metal plate, to make a matrix, and a rubber is charged and pressed in the matrix; and (ii) a photosensitive resin plate made from a photosensitive resin composition comprising a predominant amount of a synthetic rubber such as a styrene-butadiene rubber or an acrylonitrile-butadiene rubber, and a minor amount of a photopolymerizable monomer having terminal. ethylenically unsaturated double bonds.

The cast rubber plate has problems such that a substantially long time is required for making the rubber plate, the production cost is high, and the rubber plate exhibits a poor image reproducibility. The photosensitive resin plate made of a synthetic rubber has poor solvent resistance, abrasion resistance and durability, and deteriorates the working atmosphere because a halogenated hydrocarbon such as 1,1,1-trichloroethane is used.

In recent years, various photosensitive resin compositions for a flexographic printing plate have been proposed to solve the above-mentioned problems (for example, Japanese Unexamined Patent Publication No. 54-110287 and 61-22339). These proposed photosensitive compositions have other problems such that a special developing solution comprising water, an alcohol and an alkali is required for development, and the rate of development is very slow.

A photosensitive resin composition has been proposed which comprises (a) a copolymer derived from a conjugated diolefin, an α,β-ethylenically unsaturated carboxylic acid and an optional monoolefinically unsaturated monomer, (b) a photopolymerizable unsaturated monomer and (c) a photopolymerization initiator (Japanese Examined Patent Publication No. 59-29849). This photosensitive composition has some beneficial properties over the conventional photosensitive compositions, but processability, and transparency and elasticity at a low temperature of the cured product are poor. Especially in a cold northern district, a printing plate made therefrom becomes hard and is not suitable for a flexographic printing.

To solve the above-mentioned problems, the present inventors have proposed a photosensitive resin composition which comprises (a) a copolymer a conjugated diene, a methacrylate or acrylate having an acidic functional group, and optional monoolefinically unsaturated monomer or a polyfunctional vinyl monomer, (b) a photopolymerizable unsaturated monomer and (c) a photopolymerization initiator (Japanese Unexamined Patent Publication No. 4-67041). Although this photosensitive resin composition provides a cured product exhibiting enhanced transparency and elasticity at a low temperature, the time required for washing the light-exposed plate with an aqueous alkali solution for the dissolution and removal of the resin composition in the light-unexposed areas upon development in the course of making a printing plate is long; and the flexural strength is poor and the printing plate is liable to be cracked when bended.

In recent years, aqueous inks are used instead of inks of a solution form in an organic solvent in flexographic printing to avoid air pollution. The flexographic printing plate used must not be swollen with the aqueous inks. However, in the case of a photosensitive resin composition for which an aqueous alkali solution is used as the developing solution, it is difficult to satisfy the contradictory requirements that the developability with an aqueous alkali solution must be at an acceptable level and the printing plate must be resistant to the aqueous inks.

To satisfy these contradictory requirements, the present inventors have proposed a photosensitive composition for development with water which comprises (A) a phosphorus-containing hydrophilic copolymer comprised of a predominant proportion of monoolefinic unsaturated monomer units such as acrylate compound units, a phosphate ester-containing unsaturated monomer units, and optional polyfunctional vinyl monomer units, (B) a photopolymerizable unsaturated monomer, and (C) a photopolymerization initiator. Although this photosensitive composition exhibits improved washability of the light-exposed plate, i.e., enhanced efficiency of dissolution and removal of the composition in the light-unexposed areas upon development, the resulting printing plate does not have a high strength and is still liable to be swollen with an aqueous ink.

Another problem arises in a conventional photosensitive composition such that the surface of the composition is generally sticky and therefore, when a positive or negative film (hereinafter may be referred to as "original film") is applied thereon, bubbles are formed between the composition and the original film, and the light-exposure of a photosensitive layer is not effected to the desired extent, which leads to reduction in reproducibility of a relief and makes it impossible to reuse the original film applied on the photosensitized layer.

To solve the above-mentioned problem, an attempt has been made of covering the surface of a photosensitive composition with a thin film which is called as a slip film. As examples of the slip film, there can be mentioned films of polyamide or a cellulose derivative. When the light-exposed resin plate is washed, the slip film must be removed together with the photosensitive resin in the unexposed areas. Conventional slip films can easily be dissolved and removed by a halogenated hydrocarbon developing solution, but are insoluble or only slightly soluble in an aqueous developing solution and therefore are not advantageously used when an aqueous developing solution is used for the preparation of a photosensitive resin plate.

As the method for making a sheet from a photosensitive composition, there are employed, for example, a method wherein the photosensitive composition is kneaded by a mixing mill and then formed into sheet by hot pressing or calendering, and a casting method wherein a mold is charged with a solution of a photosensitive composition in a solvent and then the solvent is removed under heating. The sheet made by the former method has problems such that the surface smoothness and the precision of thickness are not satisfactory. The latter casting method has problems such that bubbles remain within the sheet and the sheet is not homogeneous.

It also has been attempted that an extruder is used in the calendering step for sheet-formation. However, the temperature for melting and kneading and the temperature for sheet-forming are high, and therefore, a neck-in occurs, i.e., the width of a sheet-form extrudate is narrower than that of the extrusion die. Further, a conventional lip formation cannot be carried out because the extrusion temperature is high, and therefore, a method wherein a bank of the composition is formed in calender rolls which leads to undesirable shrinkage of the as-formed sheet.

DISCLOSURE OF THE INVENTION

In view of the foregoing, an object of the present invention is to provide a photosensitive composition which is soluble in an aqueous developing solution and has good photosensitivity, transparency and processability, and, when cured, results in a product exhibiting a good transparency and a high elasticity at a low temperature.

Another object of the present invention is to provide a photosensitive rubber plate characterized in that, when an original film is applied on the rubber plate, undesirable adhesion of the film can be avoided, and that it can easily be developed with an aqueous developing solution.

A still another object of the present invention is to provide a process for making a photosensitive rubber plate wherein a neck-in does not occur at the sheet-forming step and the as-formed sheet does not shrink, and whereby a photosensitive rubber plate having good surface smoothness and high precision of thickness can be produced.

A further object of the present invention is to provide a flexographic printing plate and a process for making the same, characterized in that the flexographic printing plate has good toughness and reproducibility of a relief image, exhibits improved resistance to aqueous inks, and is advantageously employed for flexographic printing.

To achieve the above-mentioned objects, the inventors conducted comprehensive researches and obtained the following findings:

(i) to satisfy the washability upon development and toughness of a printing plate made from a photosensitive composition capable of being developed with an aqueous developing solution, it is effective that the photosensitive composition is predominantly comprised of a copolymer having a hydrophobic backbone and hydrophilic groups as pendant bound to the backbone;

(ii) where a phosphate ester group is introduced as the hydrophilic group, the photosensitive composition has a good processability and a good washability upon development and the flexographic printing plate exhibits a good resistance to aqueous inks;

(iii) where the above-mentioned copolymer is used in combination with a block copolymer having pseudocrosslink-ability, a flexographic printing plate having a high level of toughness can be obtained without the sacrifice of the other properties; and (iv) where the above-mentioned hydrophilic copolymer is used, sheet-formation from the photosensitive composition can be conducted at a low temperature, and consequently, minimization of neck-in and lip formation become possible.

The present invention has been completed on the basis of the above findings.

In one aspect of the present invention, there is provided a photosensitive composition comprising:

(A) 35 to 80 parts by weight of a phosphorus-containing hydrophilic copolymer represented by the following formula (3):

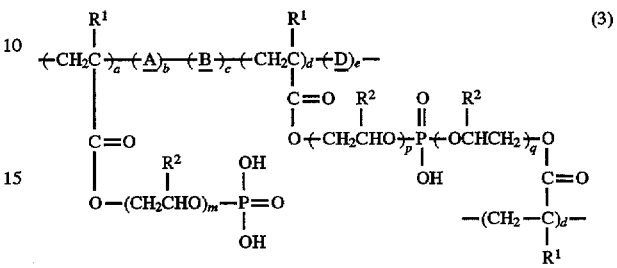

wherein a is a conjugated diene unit, B is a monoolefinically unsaturated monomer unit, d is a polyfunctional vinyl monomer unit, each of $R^1$ independently represent a hydrogen atom or a methyl group, $R^2$ independently represents a hydrogen atom or a substituted or unsubstituted alkyl group having 1 to 3 carbon atoms, m, p and q independently represent an integer of 1 to 23, and a, b, c, d and e are mole numbers of the respective recurring units and satisfy the following ratios, which are by weight:

$a/(a+d+b+c+e)=0$ to $0.30$
$d/(a+d+b+c+e)=0$ to $0.30$
$(a+d)/(a+d+b+c+e)=0.05$ to $0.30$
$b/(a+d+b+c+e)=0.40$ to $0.90$
$c/(a+d+b+c+e)=0$ to $0.50$
$e/(a+d+b+c+e)=0$ to $0.10$ (B) 65 to 20 parts by weight of thermoplastic elastomer; the sum of (A) plus (B) being 100 parts by weight;

(C) 5 to 300 parts by weight, based on 100 parts by weight of the total of (A) plus (B), of a photopolymerizable ethylenically unsaturated monomer; and (D) 0.1 to 10 parts by weight, based on 100 parts by weight of the total of (A) plus (B), of a photopolymerization initiator.

In another aspect of the present invention, there is provided a photosensitive rubber plate which is a laminated product comprising a substrate and a layer of the above-mentioned photosensitive composition formed on the major surface of the substrate.

In still another aspect of the present invention, there is provided a process for making a photosensitive rubber plate which comprises the steps of kneading the above-mentioned photosensitive composition, extruding the kneaded composition through a die, calendering the extruded composition to form a sheet laminated on a substrate.

In further aspects of the present invention, there are provided a process for making a flexographic printing plate comprising the steps of exposing the above-mentioned photosensitive rubber plate to light, and removing the photosensitive composition in the light-unexposed areas of the rubber plate by using an aqueous developing solution; and a flexographic printing plate made by this process.

BEST MODE FOR CARRYING OUT THE INVENTION

The invention will be described in detail.

The photosensitive composition of the present invention must contain the phosphorus-containing hydrophilic copolymer represented by formula (3) (ingredient (A)), the thermoplastic elastomer (ingredient (B)), the photopolymerizable unsaturated monomer (ingredient (C)) and the photopolymerization initiator (ingredient (D)).

The phosphorus-containing hydrophilic copolymer of formula (3) (ingredient (A)) used in the present invention is made by copolymerization of a mixture of (a) 5 to 30% by weight of a phosphate ester group-containing unsaturated monomer, (b) 40 to 90% by weight of a conjugated diene monomer, (c) 0 to 50% by weight of other monoolefinically unsaturated monomer, and (d) 0 to 10% of an optional polyfunctional vinyl monomer.

The phosphate ester group contained in the unsaturated monomer (a) has a function of, when the photosensitive rubber plate of the invention is developed with an aqueous alkali solution, enhancing the dissolution or dispersion in water of the photosensitive composition in the unexposed areas. It is believed that, when the light-exposed rubber plate is placed in contact with an aqueous alkali solution, the phosphoric acid moiety of the phosphate ester group promotes swelling of the photosensitive composition. Further, the phosphate ester group is advantageous over other acidic and hydrophilic groups in that the flexographic printing plate is swollen only to a lesser extent when an aqueous ink is used. It is believed that this benefit is due to the function of the ester moiety.

As the phosphate ester group-containing unsaturated monomer, there can be mentioned phosphoric acid monoesters and phosphoric acid diesters, which are represented by the following general formula (1):

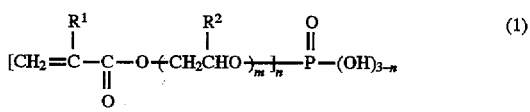

where $R^1$ is a hydrogen atom or a methyl group, $R^2$ is a hydrogen atom, or a lower alkyl group having 1 to 3 carbon atoms which may have a substituent, such as a methyl group and a halomethyl group, m is an integer of 1 to 23, and n is 1 or 2.

As specific examples of the phosphate ester group-containing unsaturated monomer of formula (1), there can be mentioned 2-acryloxyethyl phosphate, 3-acryloxypropyl phosphate, 2-acryloxypropyl phosphate, 4-acryloxybutyl phosphate, bis(2-acryloxyethyl) phosphate, bis(3-acryloxypropyl) phosphate, bis(4-acryloxybutyl), phosphate, diethylene glycol acrylate phosphate, triethylene glycol acrylate phosphate, polyethylene glycol acrylate phosphate, bis(diethylene glycol acrylate) phosphate, bis(triethylene glycol acrylate) phosphate, bis(polyethylene glycol acrylate) phosphate, 2-methacryloxyethyl phosphate, 3-methacryloxypropyl phosphate, 2-methacryloxypropyl phosphate, 4-methacryloxybutyl phosphate, bis(2-methacryloxyethyl) phosphate, bis(3-methacryloxypropyl) phosphate, bis(4-methacryloxybutyl) phosphate, diethylene glycol methacrylate phosphate, triethylene glycol methacrylate phosphate, polyethylene glycol methacrylate phosphate, bis(diethylene glycol methacrylate) phosphate, bis(triethylene glycol methacrylate) phosphate, and bis(polyethylene glycol methacrylate) phosphate. These phosphate ester group-containing unsaturated monomers may be used either alone or in combination.

Of these, 2-acryloxyethyl phosphate, 2-acryloxypropyl phosphate, 2-methacryloxyethyl phosphate and 2-methacryloxypropyl phosphate are preferable. 2-methacryloxypropyl phosphate is most preferable.

The amount of the phosphate ester group-containing unsaturated monomer (ingredient (a)) is 5 to 30% by weight, preferably 5 to 20% by weight, based on the total weight of the monomer mixture. If the amount of the monomer (a) is smaller than 5% by weight, the photosensitive composition exhibits a poor washability upon developing. In contrast, if the amount of the monomer (a) is larger than 30% by weight, the photosensitive composition has a poor processability and the flexographic printing plate is apt to have a poor resistance to an aqueous printing ink.

The conjugated diene monomer (ingredient (b)) forms the main structure of the phosphorus-containing hydrophilic copolymer and is hydrophobic. The conjugated diene monomer has a function of imparting good elasticity and resistance to an aqueous ink to the flexographic printing plate. This is because the conjugated diene monomer forms a hydrophobic moiety of the copolymer, which exhibits good resistance to an aqueous developing solution and to an aqueous ink.

As examples of the conjugated diene monomer, there can be mentioned 1,3-butadiene, isoprene, chloroprene and 1,3-pentadiene. These monomers may be used either alone or in combination. Of these, 1,3-butadiene and isoprene are preferable. The amount of the conjugated diene monomer is 40 to 90% by weight, preferably 50 to 80% by weight, based on the total weight of the monomer mixture. With the amount exceeding 90% by weight, the flexographic printing plate exhibits improved elasticity, but the washability of the photosensitive composition and the hydrophilic nature of the flexographic printing plate are reduced because of the hydrophobic nature of this monomer. With the amount of smaller than 40% by weight, the toughness of the flexographic printing plate is reduced.

As specific examples of the monoolefinically unsaturated monomer (ingredient (c)), there can be mentioned acrylic esters such as methyl acrylate, ethyl acrylate, n-butyl acrylate, 2-ethylhexyl acrylate, n-octyl acrylate, dodecyl acrylate, methoxyethyl acrylate, ethoxyethyl acrylate, cyanoethyl acrylate, hydroxyethyl acrylate and hydroxypropyl acrylate, and methacrylic esters corresponding to these acrylic esters, aromatic vinyl monomers such as styrene and α-methylstyrene, α,β-ethylenically unsaturated nitrile monomers such as acrylonitrile and methacrylonitrile, non-conjugated dienes such as ethylidenenorbornene, propenyl-norbornene and dicyclopentadiene, and vinyl chloride. These monomers may be used either alone or in combination.

The amount of the monoolefinically unsaturated monomer is 0 to 50% by weight, preferably 10 to 40% by weight, based on the total weight of the monomers, to impart balanced physical properties to the photosensitive composition. If the amount of the monoolefinically unsaturated monomer is too large, the relative amounts of the phosphate ester group-containing unsaturated monomer and the conjugated diene monomer are reduced, and consequently, the developability of the photosensitive composition and the resistance to an aqueous ink of the printing plate are reduced.

If desired, to enhance the transparency and processability of the photosensitive composition and to impart toughness and elasticity to the flexographic printing plate, a polyfunctional vinyl monomer (ingredient (d)) may be used. This monomer is a compound having at least two polymerizable unsaturated bonds in the molecule, which possess a reactivity substantially equal to each other. As specific examples of the optional polyfunctional vinyl monomer, there can be mentioned acrylic acid esters of a polyhydric alcohol and methacrylic acid esters of a polyhydric alcohol, such as ethylene glycol diacrylate, trimethylolpropane triacrylate and propylene glycol diacrylate, and polyfunctional aromatic vinyl monomers such as divinylbenzene and trivinylbenzene. Of these, ethylene glycol dimethacrylate and divinylbenzene are preferable. These polyfunctional vinyl monomers may be used either alone or in combination. The amount of these monomers is preferably not larger than 10% by weight based on the total weight of the monomers.

The procedure by which the above-mentioned copolymer is prepared is not particularly limited, but the copolymer is usually prepared by an emulsion polymerization procedure.

As an emulsifier, anionic surface active agents are usually used for emulsion polymerization. As the emulsifier, there can be mentioned, for example, conventional emulsifiers used for emulsion polymerization, which include for example alkylbenzenesulfonates, alkylsulfonates, alkylsulfate esters, fatty acid metal salts, polyoxyalkyl ether sulfate esters, polyoxycarboxylate ester sulfate esters, polyoxyethylene alkylphenyl ether sulfate esters and dialkyl succinate sulfonates. These emulsifiers may be used either alone or in combination. The amount of the emulsifier is usually in the range of 0.1 to 5% by weight based on 100 parts by weight of the monomers used.

As a polymerization initiator, a water-soluble inorganic peroxide or a combination of a water-soluble reducing agent with an organic peroxide is used. The water-soluble inorganic peroxide includes, for example, potassium persulfate and ammonium persulfate. The water-soluble reducing agent includes, for example, those which are conventionally used as a reducing agent ingredient in the catalyst for a radical redox polymerization. As examples of such reducing agents, there can be mentioned ethylenediaminetetraacetic acid, its sodium salt and potassium salt, and complexes thereof with a heavy metal such as iron, copper or chromium, sulfinic acid and its sodium salt and potassium salt, L-ascorbic acid and its sodium salt, potassium salt and calcium salt, ferrous pyrophosphate, ferrous sulfate, ammonium ferrous sulfate, sodium sulfite, sodium hydrogen sulfite, sodium formaldehyde sulfoxylate and reducing sugars. These reducing agents may be used either alone or in combination. The amount of the reducing agent is usually in the range of 0.0001 to 5 parts by weight based on 100 parts by weight of the monomers used.

As examples of the organic peroxide, there can be mentioned cumene hydroperoxide, p-cymene hydroperoxide, t-butylisopropylbenzene hydroperoxide, diisopropylbenzene hydroperoxide, p-menthane hydroperoxide, decaline hydroperoxide, t-amyl hydroperoxide, t-butyl hydroperoxide and isopropyl hydroperoxide. These organic peroxides may be used either alone or in combination. The amount of the organic peroxide is usually in the range of 0.001 to 5% by weight based on 100 parts by weight of the monomers. The organic peroxide is used in combination with the water-soluble reducing agent.

To enhance the function of the emulsifier or the polymerization initiator, used in emulsion polymerization, a higher fatty acid, a higher alcohol, an inorganic salt or a water-soluble high-molecular-weight compound can be additionally used.

The monomers, the polymerization initiator and the other ingredients used for the emulsion polymerization may be added at one time before the initiation of polymerization or optionally dividedly after the initiation of polymerization. The polymerization is usually conducted at a temperature of 0° to 80° C. in an atmosphere of an inert gas such as nitrogen, but the reaction conditions and procedures such as temperature and stirring can be voluntarily varied in the course of polymerization. The polymerization may be conducted continuously or batchwise. By the emulsion polymerization, a latex can be obtained in which copolymer particles having a diameter of approximately 0.03 to 0.7 m are dispersed.

To coagulate the thus-prepared latex, it is preferable to use at least one amine compound selected from tertiary amines, quaternary ammonium compounds, and compounds represented by the following formula (2):

wherein $R^3$ is a hydrocarbon group, $R^4$ and $R^5$ independently represent divalent hydrocarbon radicals, r and s are integers of 1 to 60, and t is 0 or 1.

As specific examples of the tertiary amine, there can be mentioned N,N-dimethylstearylamine, N,N-dimethyllaurylamine, N,N-dimethylphenylamine, N,N-dimethylnaphthylamine, N,N-diethylstearylamine, N,N-diethyllaurylamine, N,N-di ethylphenylamine, N,N-diethylnaphthylamine, N-ethyl-N-methylphenylamine, N-ethyl-N-methyllaurylamine, N-ethyl-N-methylnaphthylamine and N-ethyl-N-propylaniline.

As examples of the quaternary ammonium salt, there can be mentioned cationic surface active agents which are known as a coagulant for latexes, such as lauryltrimethylammonium chloride, stearyltrimethylammonium chloride, dilauryldimethylammonium chloride and distearyldimethylammonium chloride.

The compounds represented by formula (2) include those wherein k=0, for example, alkylamine ethylene oxide derivatives and alkylamine propylene oxide derivatives, such as N-mono(polyoxyethylene)dodecylamine, N-mono(polyoxypropylene)dodecylamine and N-mono(polyoxyethylene)stearylamine; and those wherein k=1, for example, alkylamine ethylene oxide derivatives and alkylamine propylene oxide derivatives, such as N,N-bis(polyoxyethylene)dodecylamine, N,N-bis(polyoxypropylene)dodecylamine and N,N-bis(polyoxyethylene)stearylamine.

The amine compounds may be used either alone or in combination. The amount of the coagulant is usually in the range of 0.1 to 10 parts by weight based on 100 parts by weight of the copolymer. The coagulation is effected by preparing an aqueous solution containing 0.1 to 10% by weight of the coagulant, incorporating the copolymer latex in the aqueous solution, and stirring the entire mixture at room temperature or an elevated temperature until the coagulation is completed.

The amine coagulant exhibits a mild coagulating effect as compared with a metal salt coagulant, and a high-molecular-weight polyalkylene oxide having a polyoxyethylene chain generally has a function of allowing substances, dispersed in water, to coalesce. It is believed that, although the polyoxyethylene chain of the amine coagulant is not large enough for coagulating by itself substances suspended in water, the hydrophilic copolymer can be coagulated from the latex by the above-mentioned coagulation effects of the amine group and the polyoxyethylene group.

After the copolymer latex is subjected to coagulation, conventional procedures such as dehydration and drying are employed to yield the hydrophilic copolymer used in the present invention.

The molecular weight of the hydrophilic copolymer is not particularly limited, but the number average molecular weight is usually in the range of 10,000 to 500,000, preferably 20,000 to 200,000. The procedure by which the molecular weight is modified is not particularly limited. Usually a molecular weight modifier is used which amount varies depending upon the particular kind of the molecular weight modifier and the intended molecular weight. Where a mercaptan is used as the molecular weight modifier, its amount is preferably in the range of 0.1 to 5 parts by weight based on 100 parts by weight of the monomer mixture.

The amount of the phosphorus-containing hydrophilic copolymer (ingredient (A)) is 35 to 80 parts by weight, preferably 40 to 70 parts by weight based on 100 parts by weight of the sum of ingredients (A) plus (B). Thus the amount of ingredient (B) is 65 to 20 parts by weight, preferably 60 to 30 parts by weight based on 100 parts by weight of the sum of ingredients (A) plus (B). If the amount of ingredient (A) is smaller than 35 parts by weight, the hydrophilic nature and washability of the photosensitive composition are not improved. In contrast, if the amount of ingredient (A) is larger than 80 parts by weight, although the washability of the photosensitive composition is improved, the processability of the composition and the resistance to an aqueous ink of the flexographic printing plate are reduced.

The thermoplastic elastomer (ingredient (B)) in the photosensitive composition of the present invention is a crystalline polymer having both a crystalline phase and a non-crystalline phase in the molecule, and includes, for example, crystalline 1,2-polybutadiene, a polyurethane elastomer and a polyester elastomer.

Of these thermoplastic elastomers, thermoplastic elastomeric block copolymers are preferable. The thermoplastic elastomeric block copolymers are comprised of at least two thermoplastic non-elastomeric polymer blocks and at least one elastomer block intervening between and bound to the non-elastomeric polymer blocks. The thermoplastic elastomeric block copolymers have at least one block unit represented by the formula: X–Y–X or X–Y–Z–Y–X wherein X is a thermoplastic non-elastomeric polymer block, Y is an elastomeric polymer block and Z is a coupling agent residue. As examples of the thermoplastic elastomeric block copolymers having said block unit, there can be mentioned those which are represented by the following formulae: $(X-Y)_n-X$, $(Y-X)_{n+1}Y$, $(X-Y)_{n+1}$ and $(X-Y)_m-Z$ wherein n is a number of 1 to 10 and m is a number of 2 to 7.

The proportion of the thermoplastic non-elastomeric polymer block X to the elastomeric polymer block Y is such that the block copolymer exhibits an elastomeric nature, i.e., the amount of the thermoplastic non-elastomeric polymer block X is in the range of 5 to 50% by weight, preferably 10 to 40% by weight based on the weight of the block copolymer. If the amount of the thermoplastic non-elastomeric polymer block X is larger than 50% by weight, the block copolymer is apt to be non-elastomeric and thus the photosensitive composition and the flexographic printing plate do not exhibit a rubbery elasticity to any appreciable extent. In contrast, if the amount of the thermoplastic non-elastomeric polymer block X is smaller than 5% by weight, the block copolymer becomes elastic at room temperature and thus the flexographic printing plate tends to easily shrink and have a poor dimensional stability.

The thermoplastic non-elastomeric polymer block X preferably has a number average molecular weight of 2,000 to 100,000, more preferably 5,000 to 50,000 and a glass transition temperature of at least 25° C., more preferably at least 50° C. The elastomeric polymer block Y preferably has a number average molecular weight of 25,000 to 1,000,000, more preferably 30,000 to 300,000 and a glass transition temperature of not higher than 10° C., more preferably not higher than 0° C.

A preferable thermoplastic non-elastomeric polymer block X is a homopolymer or copolymer derived from at least one monovinyl aromatic monomer selected from styrene, α-methylstyrene and ethylstyrene, or a copolymer derived from a monomer selected from these monovinyl aromatic monomers and other copolymerizable monomer. A preferable elastomeric polymer block Y is a homopolymer or copolymer derived from conjugated dienes such as 1,3-butadiene, isoprene, 2,3-dimethyl-1,3-butadiene and 1,3-pentadiene, or a copolymer derived from a monomer selected from these conjugated dienes and other copolymerizable monomer.

As specific examples of the thermoplastic elastomeric block copolymer, there can be mentioned a polystyrenepolybutadiene-polystyrene block copolymer, a polystyrene-polyisoprene-polystyrene block copolymer, poly(α-methylstyrene)-polybutadiene-poly(α-methylstyrene) block copolymer, a (polystyrene-polybutadiene)$_4$Si block copolymer, a (polystyrene-polyisoprene)$_4$Si block copolymer, hydrogenation products of these block copolymers and maleic acid-modified products of these block copolymers. Of these, those in which the thermoplastic non-elastomer block X is polystyrene and the elastomeric polymer block Y is polybutadiene or polyisoprene are especially preferable. The thermoplastic elastomer (ingredient (B)) may be used either alone or in combination.

By the incorporation of the thermoplastic elastomer (ingredient (B)), the photosensitive composition of the present invention exhibits an enhanced strength before and after the light-exposure. This strength-enhancing effect would be due to the fact that, where the thermoplastic elastomer is a block copolymer, it has a pseudo-crosslinked structure, and where the thermoplastic elastomer is a crystalline polymer, the crystalline phase has a restricted structure.

If the above-mentioned thermoplastic elastomer (ingredient (B)) is substituted by other elastomer, the resulting flexographic printing plate has a poor dimensional stability and, in some cases, the photosensitive rubber plate shrinks and consequently washing of the plate with an aqueous alkali solution becomes impossible.

If desired, polymers other than the thermoplastic elastomer can be additionally used provided that the object of the present invention is attained. As specific examples of such polymers, there can be mentioned a butadiene polymer, an isoprene polymer, a chloroprene polymer, a styrene-butadiene copolymer, a styrene-isoprene copolymer, a styrene-chloroprene copolymer, an acrylonitrile-butadiene copolymer, an acrylonitrile-isoprene copolymer, an acrylonitrile-chloroprene copolymer, a methyl methacrylate-butadiene copolymer, a methyl methacrylate-isoprene copolymer, a methyl methacrylate-chloroprene copolymer, a methyl acrylate-butadiene copolymer, a methyl acrylate-isoprene copolymer, a methyl acrylate-chloroprene copolymer, an acrylonitrile-butadiene-styrene copolymer, an acrylonitrile-isoprene-styrene copolymer, an acrylonitrile-chloroprene-styrene copolymer, an epichlorohydrin polymer, an epichlorohydrin-ethylene oxide copolymer, an epichlorohydrin-propylene oxide copolymer, an epichlorohydrin rubber, a chlorinated polyethylene, a vinyl chloride copolymer, a vinylidene chloride copolymer, a chlorinated polypropylene, a chlorinated ethylene-propylene rubber, an ethyl acrylate-acrylonitrile copolymer, a butyl acrylate-acrylonitrile copolymer, a methyl methacrylate-acrylonitrile copolymer and a butyl acrylate-styrene-acrylonitrile copolymer. These polymers may be used either alone or in combination.

As specific examples of the photopolymerizable ethylenically unsaturated monomer (ingredient (C)) contained in the photosensitive composition of the present invention, there can be mentioned aromatic vinyl monomers such as styrene, α-methylstyrene, m-methylstyrene and p-methoxystyrene; α,β-ethylenically unsaturated nitrile compounds such as acrylonitrile and methacrylonitrile; acrylates of an alkyl alcohol having 1 to 23 carbon atoms such as methyl acrylate, ethyl acrylate, propyl acrylate, n-butyl acrylate, isobutyl acrylate and t-butyl acrylate, and methacrylates corresponding to these acrylates; acrylates and methacrylates of an alkoxyalkylene glycol such as methoxy-ethylene glycol and methoxypropylene glycol; monoesters of unsaturated polyfunctional carboxylic acids such as monoethyl maleate, monomethyl fumarate and monoethyl itaconate; diesters such as dimethyl maleate, diethyl maleate, dibutyl maleate, dioctyl maleate, diethyl fumarate, dibutyl fumarate, dioctyl fumarate, dimethyl itaconate, diethyl itaconate, dibutyl itaconate and dioctyl itaconate; acrylamides and methacrylamides such as acrylamide, methacrylamide, N,N'-methylenebisacrylamide, N,N'-methylenebismethacrylamide, N,N'-hexamethylenebisacrylamide and N,N'-hexamethylenebismethacrylamide; diacrylates of glycols such as ethylene glycol diacrylate and polyalkylene glycol diacrylate (having 2 to 23 alkylene glycol units), and corresponding dimethacrylates; diacrylates, triacrylates, tetraacrylates and oligoacrylates of a polyhydric alcohols with at least trifunctionality, such as glycerine, pentaerythritol, a trimethylolalkane and a tetramethylolalkane (the alkane includes, for example, methane, ethane and propane), and corresponding dimethacrylates, trimethacrylates, tetramethacrylates and oligomethacrylates; and acrylates having an acidic functional group such as 2-acryloyloxyethyl succinate, 2-acryloylethyl hexahydrophthalate and 2-acryloyloxyethyl phosphate, and corresponding methacrylates. These photopolymerizable ethylenically unsaturated monomers may be used either alone or in combination.

The amount of the photopolymerizable ethylenically unsaturated monomer in the photosensitive composition of the present invention is 5 to 300 parts by weight, preferably 10 to 200 parts by weight, based on 100 parts by weight of the sum of ingredients (A) plus (B). If the amount of the photopolymerizable ethylenically unsaturated monomer is smaller than 5 parts by weight, the photosensitive composition does not cure to a desired extent when exposed to light, and the resulting flexographic printing plate has poor mechanical properties. In contrast, if the amount exceeds 300 parts by weight, the rubber elasticity and solvent resistance of the flexographic printing plate tend to be reduced.

As the photopolymerization initiator (ingredient (D)) contained in the photosensitive composition of the present invention, there can be mentioned those which are usually used as photopolymerization initiators and which include, for example, -diketones such as diacetyl and benzyl; acyloins such as benzoin and pivaloin; acyloin ethers such as benzoin methyl ether, benzoin ethyl ether and benzoin isopropyl ether; and polycyclic quinones such as anthraquinone and 1,4-naphthoquinone. These photopolymerization initiators may be used either alone or in combination.

The amount of the photopolymerization initiator (ingredient (D)) is 0.1 to 10 parts by weight, preferably 1 to 5 parts by weight, based on 100 parts by weight of the sum of ingredients (A) plus (B). If the amount is smaller than 0.1 part by weight, the flexographic printing plate does not cure to a desired extent when exposed to light. In contrast, the use of the photopolymerization initiator in an amount exceeding 10% by weight is not advantageous because a part of the photopolymerization initiator does not participate in the curing reaction and the rate of curing reaction tends to decrease with an absorption of irradiated light.

Ingredients other than the above-mentioned ingredients (A) through (D), which are usually incorporated in conventional photosensitive compositions, can be incorporated in the photosensitive composition of the present invention. Such ingredients include, for example, a plasticizer and a preservative stabilizer.

As examples of the plasticizer, there can be mentioned hydrocarbon oils such as a naphthene oil and a paraffin oil; low-molecular-weight polystyrene having a molecular weight of not higher than 3,000, an α-methylstyrene-vinyltoluene copolymer, a petroleum resin, a polyacrylate, a polyester resin, polyterpene resin, polyisoprene and its hydrogenated products, liquid 1,2 or 1,4-polybutadiene and its terminal-modified products, hydroxylated products and carboxylated products of these polymeric materials, a liquid acrylonitrile-butadiene copolymer and its carboxylated product, and a liquid styrene-butadiene copolymer. These plasticizers may be used alone or in combination.

The plasticizer has a function of enhancing the fluidity of the photosensitive composition of the present invention, which leads to enhancement in homogeneity of the respective ingredients in the photosensitive composition and in capability of sheet-formation. Further, the plasticizer has a function of, when the rubber printing plate is developed, promoting the removal of the photosensitive resin in the light-unexposed areas and desirably adjusting the hardness of the light-exposed areas. The amount of the plasticizer is chosen depending upon the intended properties usually within the range of 5 to 200 parts by weight, preferably 5 to 100 parts by weight, based on 100 parts by weight of the sum of ingredients (A) plus (B).

As examples of the preservative stabilizer, there can be mentioned phenols such as hydroquinone, p-methoxyphenol, p-t-butylcatechol, 2,6-di-t-butyl-p-cresol and pyrogallol, quinones such as benzoquinone, p-toluquinone and p-xyloquinone, and amines such as phenyl-α-naphthylamine.

These preservative stabilizers may be used either alone or in combination. The amount of the preservative stabilizer is usually in the range of 0.01 to 2 parts by weight based on 100 parts by weight of the sum of ingredients (A) plus (B).

The photosensitive composition of the present invention has a good photosensitivity and therefore it can be used for a flexographic printing plate and other articles which include, for example, a photoresist, a screen for screen printing, paints, coating materials, adhesives, films, sheet-form materials, impregnated materials and other shaped articles.

The procedure, by which the photosensitive composition of the present invention is prepared, is not particularly limited. For example, a kneader and a roll mill can be used for mixing and milling. The order in which the respecting ingredients are mixed and milled is also not particularly limited. As a preferable example of the procedure for preparing the photosensitive composition, there can be mentioned the following procedure.

Pellets of the hydrophilic copolymer (ingredient (A)) and pellets of the thermoplastic elastomer (ingredient (B)) are mixed together. A mixer such as a tumbling mixer or a ribbon blender can be used for the mixing. The mixture is introduced into a hopper and is conveyed by a conveyor from the outlet at the lower part of the hopper to a hopper of an extruder. The mixture is kneaded under heated conditions by a screw within a barrel to form a uniform molten mixture.

Then the photopolymerizable ethylenically unsaturated monomer (ingredient (C)), the photopolymerization initiator (ingredient (D)) and optional other ingredients are mixed together, and the thus-obtained mixture is forced to feed by a pump into an inlet at the midway of the extruder wherein the mixture of ingredients (C) and (D) and other ingredients is kneaded with the molten mixture of ingredients (A) and (B) to yield the photosensitive composition of the present invention. As the extruder used, a twin-screw extruder having a function of melting, mixing and transferring the ingredients is preferable.

The procedure by which the photosensitive composition of the present invention is made into a sheet form is not particularly limited. For example, the photosensitive composition is made into a sheet form by a shaping machine such as a press or a calender.

In one procedure for making a sheet from the photosensitive composition, the photosensitive composition is dissolved in an appropriate solvent such as chloroform, carbon tetrachloride, trichloroethane, methyl ethyl ketone, diethyl ketone, benzene, toluene and tetrahydrofuran; the resulting solution is cast in a mold; and the solvent is evaporated to obtain a sheet.

The thus-formed sheet can be pressed, extruded or calendered under heated conditions to yield a sheet having a highly precisely adjusted thickness. The so-formed sheet is preferably used as a material for making the photosensitive rubber plate.

In a preferable procedure for making a sheet from the photosensitive composition, a uniformly kneaded molten photosensitive composition is transferred and extruded by an extruder through die whereby the molten composition is converted to a preformed sheet having predetermined thickness and width. The preformed sheet is subjected to calendering, i.e., is transferred into a nip between two calender rolls having a smooth peripheral surface where it is calendered into a sheet with a precise thickness.

It is possible to pass the preformed sheet through a die before calendering whereby a sheet can be obtained which has a surface much smoother than and a thickness much more precisely adjusted than those of a sheet made without passing through a die.

The temperature of the die through which the molten photosensitive composition is passed can be appropriately determined depending upon the particular composition of the photosensitive composition, but is preferably not higher than 150° C., more preferably not higher than 140° C. At a temperature higher than 150° C., problems arise such that the photosensitive composition is colored, the time of washing with an aqueous alkali solution on development is prolonged, or the image-reproducibility of the flexographic printing plate is reduced. Since the photosensitive composition of the present invention contains the specific hydrophilic copolymer, the die can be set at a low temperature.

The photosensitive rubber plate of the present invention is a laminated product comprising a substrate and a layer of the above-mentioned photosensitive composition formed on the major surface of the substrate.

The substrate is usually made of a flexible film or sheet, and in some cases has a release layer or a primer coat layer composed of an adhesive or a primer material. The substrate used in the present invention is not particularly limited provided that it is usually used for flexographic printing plates. As examples of the substrate, there can be mentioned flexible films or sheets such as polyethylene terephthalate film, polypropylene film and polyimide film, and these films or sheets, which are lined with an elastomeric composition such as natural rubber, synthetic rubber and a plasticized vinyl chloride resin.

The photosensitive rubber plate of the present invention can have a covering film formed thereon. The covering film is made of a flexible covering film and in some cases a slip film is used. The covering film as a protector film has a function of protecting the photosensitive composition layer, and is made of a flexible film and in some cases has a release layer. The flexible covering film used in the present invention is not particularly limited provided that it is usually used as covering films. As examples of the covering film, there can be mentioned polyethylene terephthalate film, polyethylene film, polypropylene film and polystyrene film. The thickness of the covering film is usually 75 to 200 μm, preferably 100 to 150 μm. With a thickness smaller than 75 μm, the covering film does not have a strength sufficient for a protector film and the resulting photosensitive rubber plate is liable to be distorted. With a thickness exceeding 200 μm, the film has too large strength and the photosensitive composition is difficult to make into a sheet form.

The lamination of a substrate or a covering film onto the surfaces of the sheet-form photosensitive composition can be conducted by a conventional procedure. Both surfaces of the photosensitive composition are simultaneously laminated with a substrate or a covering layer, or one surface thereof is laminated with a substrate or a covering layer and the other surface is then laminated with a substrate or a covering layer. Usually calender rolls are used for the lamination.

A covering material layer formed on the photosensitive composition of the present invention can be made of a non-adherent water-soluble polymer film.

The surface of a conventional photosensitive composition is usually sticky and therefore, when an original film is applied thereon, bubbles are formed between the composition surface and the original film. This leads to, when exposed to light, irregular deflection of light hindering the light-exposure and curing of the photosensitive composition layer. Consequently, the reproducibility of a relief is deteriorated and the original film applied on the photosensitive layer becomes difficult to reuse.

To solve the above-mentioned problems, it is known to adhere a slip film (hereinafter may be called as "covering material") on the surface of the photosensitive composition. By adhering the slip film, the adhesion of the original film to the composition surface is mitigated and the original film can be reused. As the covering material, polyamides and cellulose derivatives are widely known.

In the step of developing the photosensitive composition, the covering film adhered on the composition surface must be removed together with the the photosensitive composition in the light-unexposed areas. The known covering materials can be used for a photosensitive composition for which a halogenated hydrocarbon is used as a developing solution. However, the known covering materials are insoluble or only slightly soluble in water, and therefore, they cannot be advantageously used for a photosensitive composition for which an aqueous developing solution is used. In contrast, a water-soluble polymer can be advantageously used for the formation of a covering material layer on the photosensitive rubber plate of the present invention.

As examples of the water-soluble polymer used in the present invention, there can be mentioned polyvinyl alcohol, polyvinyl pyrrolidone, polyacrylic acid, polyacrylamide, polyethylene oxide, polyethyleneimine and derivatives of these polymers. Of these, polyvinyl alcohol is preferable. Polyvinyl alcohol having a saponification degree of 60 to 100% by mole is more preferable. Polyvinyl alcohol having a saponification degree of 65 to 80% by mole and a viscosity of not more than 10 cp as measured at a temperature of 20° C. by a Höppler viscometer is most preferable.

The procedure by which the photosensitive composition is covered with the covering material layer is not particularly limited. Usually, a protector film is coated previously with a solution of the covering material by using, for example, a bar coater or an applicator, and the coated film is dried to form a covering material layer. Then the surface of the photosensitive composition is laminated with the coated film in a manner such that the covering material layer is adhered on the surface of the photosensitive composition.

The thickness of the covering material layer is not particularly limited, but is usually not larger than 10 μm after drying. With a thickness of larger than 10 μm, close adherence of the original film tends to be hindered and the reproducibility of an image is often deteriorated. In contrast, with a thickness of smaller than 0.5 μm, the effect of preventing undesirable adhesion of the original film is sometimes lost.

The thus-made photosensitive rubber composition, i.e., the laminated product made of the photosensitive composition and the substrate or the covering film, is cut into a desired size.

A flexographic printing plate can be made by a conventional procedure from the above-mentioned photosensitive rubber plate of the present invention. Namely, the exposed surface of the substrate of the photosensitive rubber plate is exposed to ultraviolet rays by a UV lamp for the formation of floor, and the covering film on the other surface of the rubber plate is then released. Then an original film is applied on the thus-exposed surface of the photosensitive composition layer and evacuation is conducted by a vacuum pump to closely adhere the original film onto the surface of the photosensitive composition layer. Then an image-wise exposure is carried out on the original film-adhered photosensitive composition layer.

The removal of the photosensitive composition in the light-unexposed areas of the rubber plate can be carried out in a manner similar to that in a conventional developing method using an aqueous developing solution. Namely, the image-wise exposed photosensitive composition is placed in contact with a developing solution charged in a developing apparatus, and the photosensitive composition in the unexposed areas is scraped off by a brush. The time required for development varies depending upon the particular thickness of the photosensitive composition layer, the depth of a relief (i.e., the thickness of the photosensitive composition to be removed), and the precision of the flexographic printing plate, but is usually in the range of 5 to 20 minutes.

The photosensitive rubber plate of the present invention is developed with an aqueous developing solution such as an aqueous dilute alkali solution. A mixed solvent composed of an aqueous alkali solution and an alcohol or a ketone, and a mixed solvent composed of a halogen-containing organic solvent and an alcohol or a ketone can also be used. As examples of the alkali used for the aqueous dilute alkali solution, there can be mentioned alkali metal hydroxides such as sodium hydroxide, potassium hydroxide and lithium hydroxide; ammonia; and alkali metal salts of a weak acid such as lithium carbonate.

The photosensitive rubber plate of the present invention can also be developed with an aqueous solution of a cationic surfactant such as lauryltrimethylammonium chloride or an amphoteric surfactant such as an alkylamine-carboxylic acid salt. However, an aqueous solution of an anionic surfactant or a nonionic surfactant is more preferable.

The anionic surfactant used is not particularly limited, and known anionic surfactants can be used, which include, for example, alkylbenzenesulfonates, alkylsulfate ester salts and succinic acid dialkylester sulfonates.

The nonionic surfactant used is not particularly limited, and known nonionic surfactants can be used, which include, for example, those which have a polyoxyethylene chain in the molecule such as polyoxyethylene lauryl phenyl ether, polyoxyethylene alkyl ethers, polyoxyethylene fatty acid esters and polyoxyethylene alkyl ether phosphate esters; and sorbitan fatty acid esters, glycerine fatty acid esters, pentaerythritol fatty acid esters, and fatty acid alkanolamides.

Of these, fatty acid alkanolamides are preferable because the developing property and the image reproducibility of the flexographic printing plate are satisfactory, the developing apparatus is not contaminated, and these surfactants do not exert a baneful influence on the human body and the working environment. Fatty acid alkanolamides of 1:2 mole type are more preferable because of enhanced developability and solubility in water. As specific examples of the 1:2 mole type fatty acid alkanolamides, there can be mentioned coconut oil fatty acid diethanolamide, lauric acid diethanolamide and stearic acid diethanolamide. 1:1 Mole type fatty acid alkanolamides can also be used, which include, for example, fatty acid monoethanolamides corresponding to the above-listed fatty acid diethanolamides.

The concentration of the developing solution is not particularly limited provided that it exhibits developability, but is usually 0.1 to 4% by weight in the case of an aqueous alkali solution and usually 0.5 to 20% by weight in the case of an aqueous solution of a surfactant. When the concentration is too low, the developability is reduced and the photosensitive composition in the unexposed areas is difficult to remove, with the result of reduction in image reproducibility of the printing plate. In contrast, when the concentration is too high, the developability is satisfactory, but much labor is required for washing the developed plate with water and treating a waste water after the development.

The development can be conducted at room temperature, but the time required for development can be shortened at an elevated temperature. However, when the developing temperature exceeds 90° C., water easily evaporates which leads to change of the concentration of the developing solution and involves a risk of a burn production. A preferable developing temperature is in the range of 40° to 70° C.

The as-developed printing plate is dried in warm air at a temperature of 70° C. for 10 to 20 minutes. The thus-dried printing plate can be used for printing. However, the surface of the plate having the unexposed areas from which the photosensitive composition has been removed can be washed with water whereby a printing plate exhibiting a more enhanced image reproducibility is obtained. If desired, the surface having the unexposed areas from which the photosensitive composition has been removed can be subjected to a post-exposure treatment using the same light source as that used for the image-wise exposure, or a treatment with halogen, to reduce the stickiness.

The invention will now be described specifically by the following examples that by no means limit the scope of the invention. In the examples parts and % are by weight unless otherwise specified.

In the examples photosensitive rubber plates were made by the following process unless otherwise specified.

Process for Making Photosensitive Rubber Plate

A uniformly mixed photosensitive composition is introduced between two calender rolls wherein the composition is calendered between two polyethylene terephthalate films each having a thickness of 0.1 mm to be formed into a sheet having the polyethylene terephthalate films adhered on both surfaces and having a thickness of 3 mm. Cold air is blown against the thus-formed sheet to yield a photosensitive rubber plate.

If desired, one of the polyethylene terephthalate films is previously coated with a covering material and the thus-coated film is used for the production of the photosensitive rubber plate by the above-mentioned process.

Properties of photosensitive compositions, photosensitive rubber plates and flexographic printing plates were determined by the following methods.

(1) Processability

A photosensitive composition is twined around a roll having a diameter of 6 inches at a temperature of 80 to 120° C. The state of the composition twined is evaluated and the evaluation results are expressed by the following two ratings A and C.

A: The composition is well twined around the roll and a problem of shrinking does not arise.

C: The composition is not satisfactorily twined around the roll and its stickiness is too large to process in a proper manner.

(2) Solubility in Aqueous Alkali

After exposure to light, a sheet of a photosensitive composition or a photosensitive rubber plate is scraped by using a nylon brush in an aqueous 1% by weight sodium hydroxide solution at 40° C. whereby the photosensitive layer in the light-unexposed areas is dissolved and removed. The solubility in aqueous alkali is expressed by the time required for dissolving ⅓ (corresponding to 1 mm) of the thickness of the sheet or plate. The smaller the time, the higher the solubility in aqueous alkali.

(3) Hardness

Each surface of a sheet of a photosensitive composition or each surface of a photosensitive rubber plate is exposed to light for 10 minutes by using a UV lamp at an irradiation intensity of 5 mW/cm$^2$ to form cured products. The hardness of the cured products is measured according to JIS K6301.

(4) Resistance to Aqueous Ink (Degree of Swelling)

Each surface of a sheet of a photosensitive composition or each surface of a photosensitive rubber plate is exposed to light for 10 minutes by using a UV lamp at an irradiation intensity of 5 mW/cm$^2$ without the intermediary of a negative film to give a cured sheet or plate. The sheet or plate is blanked into a disc having a diameter of 3 cm. The disc is immersed in an aqueous ink, which is commercially available as an aqueous ink for flexographic printing, for 24 hours, and the degree of swelling is determined, which is expressed by the formula:

$$[(B-A)/A] \times 100(\%)$$

wherein A is weight of the disc as measured before immersion, and B is weight of the disc as measured after immersion. The smaller the degree of swelling, the better the resistance to an aqueous ink.

(5) Rate of Development

Six specimens each having a square shape of 3 cm×3 cm are cut from a sheet of a photosensitive composition or a photosensitive rubber plate. A polyethylene terephthalate film on one side of each specimen is released. The thus-exposed surface of the photosensitive composition layer of the specimen is developed with a developing solution (an aqueous 2% solution) at 50° C. for 3, 6, 9, 12, 15 and 18 minutes by using a developing apparatus for flexographic printing plate (JOW-A2-SS type, supplied by Nihon Denshi Seiki K. K.). The developed specimen is washed with water and then dried at 70° C. for 20 minutes.

The thickness of the sheet or plate is measured before development and measured after development for the respective times and drying. The rate of development is expressed by the thickness reduction per minute of development (mm/min).

(6) Degree of Resolution (Reproducibility)

One entire surface of a sheet of a photosensitive composition is exposed to light at an irradiation intensity of 5 mW/cm$^2$ by using a UV exposing apparatus (JE-A2-SS type, supplied by Nihon Denshi Seiki K. K.) provided with a UV lamp. A polyethylene terephthalate film is released from the other surface, i.e., unexposed surface, of the sheet, and a negative film for reproduction evaluation having testing patterns having an optical density of 3.8 is closely applied onto the surface of the sheet. Then the negative film-applied sheet is imagewise exposed to light at a wavelength of 320 to 400 nm for a predetermined time by using the above-mentioned UV exposing apparatus. Then the negative film is released, and the light-exposed sheet is developed with an aqueous 1% sodium hydroxide solution at 40° C. (in some cases at 50° C.) by using the same developing apparatus for flexographic printing plate as that used for the determination of rate of development and is scraped by a nylon brush whereby the photosensitive composition in the light-unexposed areas is removed. The development (i.e., dissolution) is conducted for a time during which 1.5 mm of the thickness of the sheet is removed (this developing time is calculated from the rate of development as measured in the preceding paragraph (5)).

The developed sheet is then washed with water and dried at 70° C. for 20 minutes, and the surface, from which the photosensitive composition in the light-unexposed areas has been removed, is subjected to a postexposure for 10 minutes by using the same UV exposing apparatus as that mentioned above whereby a relief image for the evaluation of reproduction is formed.

Using a microscope (50×magnification), the reproduced state of a fine line in a protruding area of the relief image and the depth of a reverse fine line in a depressed area of the relief image are observed. Detail evaluation is conducted according to the following standards.

(i) Reproduction of Protruding Line with 0.2 mm Width

The state of the protruding line, wherein the line is not distorted, and its width is uniform along the length and the same as that of the corresponding line in the negative film, is regarded as the state wherein the line is completely reproduced. The reproduction of the protruding line is evaluated according to the following standard.

A: the protruding line is not distorted and its width is uniform (the line in negative film is completely reproduced).

B: the protruding line is distorted to a slight extent and is thickened at some places along the length (the line in the negative is nearly completely reproduced).

C: the protruding line is distorted and its width is not uniform along the length (the line in the negative film is incompletely reproduced).

(ii) Reproduction of Reverse Line with 0.7 mm Width

The state of a reverse line having a width of 0.7 mm and a depth of about 150 μm, wherein the line is not notched, both side edges thereof are sharp and the depression of the line is deep, is regarded as the state wherein the reverse line is completely reproduced. The reproduction of the reverse line is evaluated according to the following standard.

A: the reverse line forms a deep groove and both side edges thereof are sharp (the line in the negative film is completely reproduced).

B: the reverse line does not form a deep groove but is practically acceptable (the line in the negative film is nearly completely reproduced).

C: the reverse line forms a shallow groove (the line in the negative film is incompletely reproduced).

(iii) Reproduction of Halftone

The state of 5% dots with 65 lines, which is the same as the state of the dots in the negative film, is regarded as the state wherein the halftone in the negative film is completely reproduced. The reproduction of halftone is evaluated according to the following standard.

A: 5% dots with 65 lines are the same as those in the negative film (the halftone in the negative film is completely reproduced).

B: the dots are defective to some extent (the halftone in the negative film is nearly completely reproduced).

C: the dots are defective to a considerable extent (the halftone in the negative film is incompletely reproduced).

In the above-mentioned three reproduction tests, rating A means that the printing plate exhibits a most satisfactory reproducibility of original image.

(7) Rubbery Elasticity

The measurement is conducted on the flat area of a specimen for a relief image evaluation according to BS-903, Pt. A. 8 tripso-testing method. When a pendulum is struck against a sample, the spring back angle $\theta d$ is measured. An impact resilience R (%) is calculated from the formula:

$$R(\%) = [(1-\cos \theta d)/(1-\cos \theta c)] \times 100$$

wherein $\theta c$ is angle of the pendulum as measured before it is struck against the sample and is set at 45° in this test. The rubbery elasticity is evaluated according to the following standard.

A: the impact resilience value is at least 60%.

B: the impact resilience value is at least 50% but less than 60%.

C: the impact resilience value is less than 50%.

(8) Surface Stickiness

The surface stickiness is evaluated by the adhesion between the sheet of a photosensitive composition and the negative film.

(9) Thickness and Thickness Precision of Photosensitive Composition Layer

A sheet of a photosensitive composition or a photosensitive rubber plate is cut into a square specimen having a size of 10 cm×10 cm, and the total thickness (t) of the specimen including the substrate and the covering film is measured at places in the specimen by using a linear dial gauge (supplied by Ozaki Mfg. Co.). Thickness (x) of the printing sheet or plate and the range (R) of thickness are calculated from the following equations:

Thickness of printing plate×(mm)=$\Sigma t/n$

Range $R$ (mm)=$t_{max} - t_{min}$ wherein $t_{max}$ and $t_{min}$ represent the maximum value and minimum value of the measured thickness, respectively, and n is number of places at which the measurement is conducted. The smaller the value of range R, the better the precision of thickness.

(10) Warpage of Photosensitive Composition Sheet

A photosensitive composition sheet or a photosensitive rubber plate is cut into a rectangular specimen having a size of 30 cm×10 cm. Covering films are released from the sheet or plate specimen. The specimen is placed on the flat surface of a table, and the height of an edge portion of the specimen from the table surface is measured. The lower the measured height, the more satisfactory the shrinkage of the specimen. The warpage of the photosensitive composition sheet or the photosensitive rubber plate is evaluated according to the following standard.

A: the measured height is zero or nearly zero.

B: the measured height is 3 to 10 mm.

C: the measured height is 11 mm or higher.

(11) Surface Roughness (Ra) of Photosensitive Composition Layer

A photosensitive rubber plate is cut into a square specimen having a size of 1 cm×1 cm and a covering film is released. The surface roughness (Ra) of the photosensitive layer is measured on an area of 200 µm×200 µm by using a laser microscope (a color scanning laser microscope, 1LM211, supplied by Lasertec Co.). The smaller the average surface roughness value, the better the surface smoothness. The average surface roughness is evaluated according to the following standard.

A: the average surface roughness is not larger than 0.3 µm.

B: the average surface roughness is in the range of 0.4 to 1.0 µm.

C: the average surface roughness is at least 1.1 µm.

(12) Shaped State of (Presence of Bubbles in) Photosensitive Composition Sheet

A photosensitive composition sheet having a thickness of 3 mm is cut into a rectangular specimen having a size of 30 cm×10 cm, and the number of bubbles present in the rectangular specimen is visually checked. The evaluation is carried out according to the following standard.

A: bubbles are not found in the photosensitive composition sheet.

B: 1 or 2 small bubbles are found in the photosensitive composition sheet.

C: A large bubble or a plurality of small bubbles are found in the photosensitive composition sheet.

(13) Shaped State (Transparency) of Photosensitive Composition Sheet

The transparency is visually observed on a photosensitive composition sheet having a thickness of 3 mm. No turbidity means that the sheet has an excellent transparency. The evaluation is conducted according to the following standard.

A: there is little or no turbidity and the transparency is practically acceptable.

B: the sheet is turbid to some extent.

C: there is great turbidity and practically acceptable reproduction of image cannot be obtained.

REFERENCE EXAMPLE 1

An autoclave having an inner volume of 10 liters was charged with the monomers and other ingredients for polymerization, which are shown in Table 1. The monomers were polymerized at 50° C. and, when the conversion reached 95%, a shortstopper was added to stop the polymerization. The polymerization mixture was cooled to yield an emulsion. The emulsion was frozen to be thereby coagulated. Crumbs were separated, washed with water and dried in vacuo at 60° C. whereby a copolymer was obtained.

TABLE 1

| Monomer and other ingredients for polymerization | Amount (parts) |
| --- | --- |
| Butadiene | 60 |
| Methyl acrylate | 9 |
| 2-Methacryloxyethyl phosphate | 20 |
| Styrene | 10 |
| Divinylbenzene | 1 |
| Sodium dodecylbenzenesulfonate | 4 |
| Potassium persulfate | 0.3 |
| t-Dodecyl mercaptan | 0.4 |
| Water | 200 |

REFERENCE EXAMPLE 2

A copolymer was prepared by repeating the procedure of Reference Example 1 wherein 20 parts of methyl methacrylate was used instead of the total of methyl acrylate, styrene and divinylbenzene with all other conditions remaining the same.

COMPARATIVE REFERENCE EXAMPLE 1

A copolymer was prepared by repeating the procedure of Reference Example 1 wherein divinylbenzene and styrene were not used and the amounts of 2-methacryloxyethyl phosphate and methyl acrylate were changed to 3 parts and 37 parts, respectively, with all other conditions remaining the same.

EXAMPLE 1a

The copolymer prepared in Reference Example 1 and the ingredients shown in Table 2 were kneaded together at 150° C. by using a kneader. When the kneaded mixture was uniform, the mixture was cooled to 120° C. and the ingredients shown in Table 3 were added and the mixture was further kneaded to obtain a photosensitive composition.

TABLE 2

| Ingredients | Amount (parts) |
| --- | --- |
| Copolymer | 65 |
| SBS block copolymer*[1] | 35 |
| Liquid polybutadiene*[2] | 50 |
| 2,6-Di-t-butyl-p-cresol | 0.2 |

*[1]Styrene-butadiene-styrene block copolymer, supplied by Shell Chemical Co., Cariflex TR, KX-65
*[2]Nisso PB, B-1000, supplied by Nippon Soda Co.

TABLE 3

| Ingredients | Amount (parts) |
| --- | --- |
| 1,6-Hexanediol diacrylate | 10 |
| 1,6-Hexanediol dimethacrylate | 5 |
| Benzoin methyl ether | 1 |
| Methylhydroquinone | 0.02 |

Each photosensitive composition was sandwiched between two polyethylene terephthalate films each having a thickness of 0.1 mm, and was press-formed into a sheet having a thickness of 3.0 mm at a temperature of 90° to 130° C. by using a vacuum press. The photosensitive composition could be maintained at a solid state and exhibited a good handling property.

A polyethylene terephthalate film on one side of the photosensitive composition sheet was released, and a negative film having an optical density of 3.8 was closely adhered on the surface of the photosensitive composition sheet. The negative film-adhered surface was exposed to ultraviolet rays with a wavelength of 320 to 400 nm at an irradiation intensity of 5 mW/cm$^2$ for 5 minutes by using a commercially available ultraviolet exposing apparatus for a photosensitive resin. The UV-exposed sheet was developed with an aqueous 1% sodium hydroxide solution whereby the photosensitive composition in the UV-unexposed areas was completely dissolved and removed to give a flexographic printing plate having an original image reproduced with a high fidelity. The printing plate had a rubbery elasticity and its hardness was 52 (Shore A) as measured at 20° C. Using this printing plate, flexographic printing was conducted with an aqueous printing ink. The obtained prints had images reproduced with a high fidelity.

EXAMPLES 1b AND 1c AND COMPARATIVE EXAMPLES 1a, 1b AND 1c

By the same procedures as those mentioned in Example 1a, photosensitive compositions were prepared from the same copolymer as that used in Example 1a and the ingredients shown in Table 4, and flexographic printing plates were made from the photosensitive compositions and their properties were evaluated. The evaluation results are shown in Table 4. In Table 4, "ND" means that the evaluation was not coducted.

TABLE 4

| | Examples | | | Comparative Examples | | |
| --- | --- | --- | --- | --- | --- | --- |
| | 1a | 1b | 1c | 1a | 1b | 1c |
| Composition (I) | | | | | | |
| Copolymer | 65 | 65 | 65 | 30 | 100 | 65 |
| SBS*[1] | 35 | 25 | — | — | — | — |
| SIS*[2] | — | 10 | 35 | 70 | — | — |
| SBR*[3] | — | — | — | — | — | 35 |
| Liquid polybutadiene | 50 | 50 | 50 | 50 | 50 | 50 |
| BHT*[4] | 0.2 | 0.2 | 0.2 | 0.2 | 0.2 | 0.2 |
| Properties | | | | | | |
| Processability | A | A | A | C | C | A |
| Aqueous ink resistance | 2.3 | 1.7 | 2.0 | 1.0 | 15.5 | 2.4 |
| Solubility in aqueous alkali | 12 | 10 | 7.2 | 28.0 | 2.5 | 60< |
| Hardness (Shore A) | 52 | 45 | 42 | 42 | 57 | 55 |
| Reproduction of protruding fine line | A | A | A | C | B | ND |
| Reproduction of reverse fine line | A | A | A | C | C | ND |
| Rubbery elasticity | 64 | 65 | 61 | 67 | 40 | ND |

*[1]Styrene-butadiene-styrene block copolymer
*[2]Styrene-isoprene-styrene block copolymer, "Crayton TR 1107" supplied by Shell Chem. Co.
*[3]Styrene-butadiene copolymer, "NS-310" supplied by Nippon Zeon Co.
*[4]2,6-Di-t-butyl-4-methylphenol As seen from Table 4, the photosensitive composition of the present invention, which comprises specific amounts of a thermoplastic elastomer and a copolymer having specific amounts of a phosphate ester group-containing monomer and other monomers, exhibited improved processability and developability with an aqueous alkali solution. The cured product made therefrom exhibited improved resistance to an aqueous ink and preferred hardness, and thus, is valuable as a water-soluble photosensitive rubber plate material.

In contrast, the photosensitive composition containing a salient amount of a thermoplastic elastomer (Comparative Example 1a) required a long time for dissolution and removal of the photosensitive composition in the light-unexposed areas and the printing plate made therefrom had a poor reproduction of original image. The photosensitive composition containing no thermoplastic elastomer (Comparative Example 1b) exhibited a poor resistance to an aqueous ink and the printing plate made therefrom had a poor reproduction of original image. The photosensitive composition containing a non-thermoplastic elastomer instead of a thermoplastic elastomer (Comparative Example 1c) could not result in a printing plate because the photosensitive composition in the light-unexposed areas could not be dissolved due to shrinkage of the sheet. Thus evaluation of the fine line reproduction and rubbery elasticity were not conducted.

EXAMPLES 2a, 2b AND 2c AND COMPARATIVE EXAMPLES 2a, 2b AND 2c

By the same procedures as those mentioned in Example 1a, photosensitive compositions were prepared wherein the copolymers having compositions shown in Table 5 were used with all other conditions remaining the same, and flexographic printing plates were made from the photosensitive compositions and their properties were evaluated. The evaluation results are shown in Table 5.

TABLE 5

|  | Examples | | | Comparative Examples | | |
| --- | --- | --- | --- | --- | --- | --- |
|  | 2a | 2b | 2c | 2a | 2b | 2c |
| Composition of copolymer (parts) | | | | | | |
| Butadiene | 60 | 60 | 60 | 30 | 60 | 60 |
| Methyl acrylate | 10 | — | 29 | 40 | — | 10 |
| Ethyl acrylate | — | 20 | — | — | 27 | — |
| 2-Methacryloxyethyl phosphate | 20 | 20 | 10 | 20 | 3 | — |
| Styrene | 10 | — | — | 10 | 10 | 10 |
| Divinylbenzene | — | — | 1 | — | — | — |
| Methacrylic acid | — | — | — | — | — | 20 |
| Properties | | | | | | |
| Processability | A | A | A | C | A | A |
| Aqueous ink resistance | 2.1 | 2.5 | 1.4 | 5.1 | 0.6 | 1.5 |
| Solubility in aqueous alkali | 15 | 10 | 18 | 16.5 | Insoluble | Insoluble |
| Hardness (Shore A) | 50 | 48 | 51 | 50 | 45 | 65 |
| Reproduction of protruding fine line | A | A | A | B | ND | ND |
| Reproduction of reverse fine line | B | A | A | B | ND | ND |
| Rubbery elasticity | 56 | 52 | 50 | 38 | ND | ND |

As seen from Table 5, by using the specific copolymer used in the present invention, a photosensitive composition exhibiting improved processability and developability with an aqueous alkali developing solution and resulting in a cured product having an improved resistance to an aqueous ink and a preferred hardness could be obtained, and the photosensitive composition is valuable as a water-soluble photosensitive rubber plate material.

In contrast, when a copolymer containing a reduced amount of butadiene units was used (Comparative Example 2a), the resulting photosensitive composition had required a long time for dissolution and removal thereof in the light-unexposed areas upon development, and resulted in a printing plate having a poor reproduction of original image and a low strength. When a copolymer containing a reduced amount of phosphate ester group-containing monomer units was used (Comparative Example 2b) or when a copolymer containing methacrylic acid units instead of the phosphate ester group-containing monomer units was used (Comparative Example 2c), the photosensitive composition in the light-unexposed areas could not be dissolved upon development and a printing plate could not be obtained. Therefore the evaluation of fine line reproduction and rubbery elasticity was not conducted.

EXAMPLES 3a TO 3f AND COMPARATIVE EXAMPLE 3a

By the same procedures as those mentioned in Example 1a, photosensitive compositions were prepared wherein the copolymer prepared in Reference Example 1 was used, and flexographic printing plates were made from the photosensitive compositions wherein the time for UV exposure was changed to 4 minutes and the developing solutions shown in Table 6 were used instead of the aqueous sodium hydroxide solution with all other conditions remaining the same. The properties of the printing plates were evaluated by the same method as that in Example 1a. The evaluation results are shown in Table 6.

TABLE 6

| Composition of developing solution | pH of developing solution | Rate of development (mm/min) | 1.5 mm Developing time(min) | Reproduction of protruding 0.2 mm fine line | Reproduction of reverse 0.7 mm fine line | Reproduction of halftone | Resistance to aqueous ink |
| --- | --- | --- | --- | --- | --- | --- | --- |
| Examples | | | | | | | |
| 3a Coconut oil fatty acid diethanol amide | 9.5 | 0.21 | 7.1 | A | A | A | 1.7 |
| 3b Sodium dialkylsulfosuccinate | 7.7 | 0.12 | 12.5 | A | A | A | 1.9 |
| 3c sodium dodecylbenzenesulfonate | 7.6 | 0.12 | 12.5 | A | A | A | 1.8 |
| 3d Polyoxyethylene lauryl ether*1 | 7.6 | 0.087 | 17.2 | A | A | A | 2.0 |
| 3e Lauryltrimethyl- | 6.6 | 0.063 | 23.8 | B | B | C | 2.5 |

TABLE 6-continued

| Composition of developing solution | pH of developing solution | Rate of development (mm/min) | 1.5 mm Developing time(min) | Reproduction of protruding 0.2 mm fine line | Reproduction of reverse 0.7 mm fine line | Reproduction of halftone | Resistance to aqueous ink |
|---|---|---|---|---|---|---|---|
| ammonium chloride 3f Sodium carbonate (1.0% aqu. solution) | 11.6 | 0.087 | 17.2 | B | B | B | 3.2 |
| Comparative Examples | | | | | | | |
| Water | 6.8 | 0.02 | 75 | C | B | C | 1.7 |

*¹Mole number of ethylene oxide added is 9

EXAMPLES 3g

By the same procedures as those mentioned in Example 3a, a photosensitive composition was prepared wherein the copolymer prepared in Reference Example 2 was used with all other conditions remaining the same, and a flexographic printing plate was made from the photosensitive composition. The printing plate could be obtained in a short time and exhibited a good reproduction of original image. The properties of the printing plate were evaluated by the same method as that in Example 1a. The evaluation results are shown in Table 7. Prints made by using the printing plate had images with a high fidelity.

COMPARATIVE EXAMPLES 3b

By the same procedures as those mentioned in Example 3a, a photosensitive composition was prepared wherein the copolymer prepared in Comparative Reference Example 1 was used with all other conditions remaining the same. This photosensitive composition could not be developed because the friction between the photosensitive composition and a brush was too large and the photosensitive composition was undesirably separated from the developing apparatus. The resistance to an aqueous ink is shown in Table 7.

As seen from Tables 6 and 7, flexographic printing plates exhibiting a good reproduction of original images with a high fidelity could be obtained from the photosensitive compositions of the present invention within a short time. When flexographic printing was conducted by using the flexographic printing plates and an aqueous ink, prints exhibiting a reproduction of image with a high fidelity were obtained. Especially when an aqueous solution of an anionic surface active agent or a nonionic surface active agent is used as the developing solution, the developing time could be shortened and the resolving power and the resistance to an aqueous ink were excellent. These benefits were more conspicuous when coconut oil fatty acid diethanolamide was used as the developing agent.

TABLE 7

|  | Examples | | Co. Ex. |
|---|---|---|---|
|  | 3a | 3g | 3b |
| Composition of copolymers (parts) | | | |
| Butadiene | 60 | 60 | 60 |
| Methyl acrylate | 9 | — | 37 |
| Methyl methacrylate | — | 20 | — |
| 2-Methacryloxyethyl phosphate | 20 | 20 | 3 |
| Styrene | 10 | — | — |
| Divinylbenzene | 1 | — | — |

TABLE 7-continued

|  | Examples | | Co. Ex. |
|---|---|---|---|
|  | 3a | 3g | 3b |
| Properties | | | |
| Rate of development (mm/min) | 0.21 | 0.18 | ND*¹ |
| 1.5 mm Developing time | 7.1 | 8.3 | ND |
| Reproduction of protruding 0.2 mm fine line | A | A | ND |
| Reproduction of reverse 0.7 mm fine line | A | A | ND |
| Reproduction of halftone | A | B | ND |
| Resistance to aqueous ink | 1.7 | 1.9 | 0.8 |

*¹ND: Development could not be conducted.

REFERENCE EXAMPLE 3

A covering material solution composed of 10 parts of polyvinyl alcohol having a saponification degree of 70% by mole and 90 parts of water was prepared. A polyester film having a thickness of 125 μm was coated with the covering material solution by using a 1/1000 inch coater. The coating was dried at 110° C. for 1 minute in a drier to obtain a polyester film having a covering material layer on the surface thereof (covering film P).

A covering material solution composed of 10 parts of ethyl cellulose and 90 parts of chloroform was prepared. A polyester film having a covering material layer on the surface thereof (covering film C) was made from the covering material solution and a polyester film having a thickness of 125 μm by the same procedure as that described above.

EXAMPLE 4a

By the same procedure as that described in Reference Example 1, a copolymer was prepared wherein the monomers and other ingredients shown in Table 8 were used with all other conditions remaining substantially the same.

TABLE 8

| Monomers and other ingredients for polymerization | Amount (parts) |
|---|---|
| Butadiene | 50 |
| Butyl acrylate | 35 |
| 2-Methacryloxyethyl phosphate | 15 |
| Sodium dodecylbenzenesulfonate | 2 |
| Potassium persulfate | 0.3 |
| t-Dodecyl mercaptan | 0.4 |
| Water | 200 |

To 100 parts of the copolymer, 20 parts of nonaethylene glycol dimethacrylate and 20 parts of nonaethylene glycol acrylate as photopolymerizable ethylenically unsaturated monomers, 1.5 parts of benzoin methyl ether as a polymerization initiator, and 0.2 part of hydroquinone as a preservative stabilizer were added, and the mixture was kneaded at 80° C. for 10 minutes by using a Brabender whereby a photosensitive composition was obtained.

The photosensitive composition was sandwiched between two polyethylene terephthalate films each having a thickness of 125 μm, and was press-formed into a sheet having a thickness of 3.0 mm by using a vacuum press. A polyethylene terephthalate film on one side of the photosensitive composition sheet was released, and then, the polyester film having a covering material layer prepared in Reference Example 3 was closely adhered onto the thus-exposed surface of the photosensitive composition sheet by using press rolls so that the covering layer of the polyester film was placed directly in contact with the photosensitive composition. The entire surface of the polyethylene terephthalate film on the other side of the photosensitive composition sheet (i.e., the surface opposite to the side of the polyester having a covering layer) was irradiated with ultraviolet rays whereby back-exposure was conducted. Then the adhered polyester film was released, and a negative film having an optical density of 3.8 was closely adhered onto the thus-exposed surface of the photosensitive composition sheet. The exposed surface of the negative film-adhered surface was exposed to ultraviolet rays with a wavelength of 320 to 400 nm at an irradiation intensity of 5 mW/cm$^2$ for 5 minutes by using a commercially available ultraviolet exposing apparatus for photosensitive resin. The UV-exposed sheet was developed with an aqueous 1% sodium hydroxide solution whereby the photosensitive composition in the UV-unexposed areas was completely dissolved and removed to give a flexographic printing plate having an original image reproduced with a high fidelity. The printing plate had a rubbery elasticity and its hardness was 59 (Shore A) as measured at 20° C. Using this printing plate, flexographic printing was conducted with an aqueous printing ink. The obtained prints had images reproduced with a high fidelity. The properties of the printing plate are shown in Table 10.

EXAMPLES 4b TO 4d AND COMPARATIVE EXAMPLES 4a TO 4c

By the same procedures as those mentioned in Example 4a, copolymers were prepared from the monomers shown in Table 10 with all other conditions remaining the same, photosensitive compositions were prepared, and flexographic printing plates were made from the photosensitive compositions and their properties were evaluated. The evaluation results are shown in Table 10.

EXAMPLES 4e

The ingredients shown in Table 9 and the same copolymer as that prepared in Example 4d were kneaded together at 150° C. by using a kneader. When the kneaded mixture became uniform, the temperature was lowered to 110° C. Then the ingredients shown in Table 3 were added to the mixture, and the resultant mixture was kneaded for 10 minutes to obtain a photosensitive composition.

TABLE 9

| Ingredients | Amount (parts) |
| --- | --- |
| Copolymer | 65 |
| SBS block copolymer*[1] | 35 |
| Liquid polybutadiene*[2] | 40 |
| 2,6-Di-t-butyl-p-cresol | 2 |

*[1]Styrene-butadiene-styrene block copolymer, supplied by Shell Chemical Co., Cariflex TR, KX-65
*[2]Nisso PB, B-1000, supplied by Nippon Soda Co.

By the same procedures as those described in Example 4a, a flexographic printing plate was made from the above photosensitive composition and its properties were evaluated. The evaluation results are shown in Table 10.

COMPARATIVE EXAMPLE 4d

By the same procedures as those described in Example 4a, a flexographic printing plate was made wherein covering film C was used instead of covering film P with all other conditions remaining the same. The properties of the printing plate were evaluated. The results are shown in Table 10.

TABLE 10

|  | Examples | | | | | Comparative Examples | | | |
| --- | --- | --- | --- | --- | --- | --- | --- | --- | --- |
|  | 4a | 4b | 4c | 4d | 4e | 4a | 4b | 4c | 4d |
| Composition of copolymer (parts) | | | | | | | | | |
| Butadiene | 50 | 50 | 50 | 50 | 50 | 30 | 50 | 50 | 50 |
| Buthyl acrylate | 35 | 25 | — | — | — | 45 | — | 35 | 35 |
| Ethyl acrylate | — | — | 34.6 | 24.6 | 24.6 | — | 47 | — | — |
| 2-Methacryloxyethyl phosphate | 15 | 15 | 15 | 15 | 15 | 15 | 3 | — | 1 |
| Styrene | — | 10 | — | 10 | 10 | 10 | — | — | — |
| Divinylbenzene | — | — | 0.4 | 0.4 | 0.4 | — | — | — | — |
| Methacrylic acid | — | — | — | — | — | — | — | 15 | — |
| Covering film | P | P | P | P | P | P | P | P | C |
| Properties | | | | | | | | | |
| Surface stickness | Not | Not | Not | Not | Not | Not | Not | Not | Not |
| Aqueous ink resistance | 2.3 | 2.0 | 1.8 | 1.8 | 2.2 | 5.3 | 4.7 | 8.2 | ND |
| Solubility in aq. alkali | 3.6 | 4.5 | 4.1 | 3.9 | 12 | 4.8 | Insoluble | Insoluble | ND |
| Hardness (Shore A) | 59 | 54 | 58 | 55 | 55 | 53 | 58 | 64 | ND |
| Reproduction of protruding fine line | A | A | A | A | A | B | ND | ND | ND |

TABLE 10-continued

| | Examples | | | | | Comparative Examples | | | |
|---|---|---|---|---|---|---|---|---|---|
| | 4a | 4b | 4c | 4d | 4e | 4a | 4b | 4c | 4d |
| Reproduction of reverse fine line | B | A | A | A | A | C | ND | ND | ND |
| Rubbery elasticity | B | B | B | B | A | A | ND | ND | ND |

As seen from Table 10, by forming a covering material layer on the photosensitive composition, a photosensitive rubber plate can be obtained which has benefits such that undesirable sticking of the photosensitive composition to a negative film can be avoided and the negative film can easily be released, the photosensitive composition is not swollen with an aqueous ink, and a relief exhibiting an excellent reproduction of image can easily be formed.

In contrast, the photosensitive composition comprising a phosphorus-containing hydrophilic copolymer containing only a minor amount of butadiene resulted in a printing plate exhibiting a low resistance to an aqueous ink, a poor reproduction of original image and a low strength (Comparative Example 4a). When the photosensitive composition comprising a phosphorus-containing hydrophilic copolymer containing only a minor amount of a phosphate ester group-containing unsaturated monomer (Comparative Example 4b) or the photosensitive composition comprising a copolymer prepared by using an acidic monomer instead of a phosphate ester group-containing unsaturated monomer (Comparative Example 4c) is used, the composition could not be dissolved in the light-unexposed areas and thus a printing plate could not be obtained. Thus evaluation of resolving power and rubbery elasticity were not conducted.

When ethyl cellulose was used as a covering material, the photosensitive composition did not exhibit surface stickiness but could not be developed with an aqueous 1% sodium hydroxide solution because it was insoluble in the developing solution (Comparative Example 4d). The physical properties were not evaluated.

EXAMPLE 5a

Pre-mixing of 65 parts of the copolymer prepared in Reference Example 1, 35 parts of a styrene-butadiene-styrene block copolymer (SBS, Cariflex TR-1116, supplied by Shell Chem. Co.) and 0.2 part of 2,6-di-t-butyl-p-cresol was conducted by using a ribbon blender. The mixture was automatically metered and fed into a twin-screw extruder, where the mixture was kneaded and melted.

A warm solution having a composition shown in Table 11 was prepared, and was forced by a pump to flow into the extruder through an inlet in the middle of the extruder. The combined mixtures were kneaded together while deaeration and filtration were conducted, and the kneaded mixture was extruded through a die maintained at 120° C. whereby a photosensitive composition was obtained.

By the same procedures as those in Example 4a, a photosensitive rubber plate was made and its properties were evaluated. The results are shown in Table 13.

TABLE 11

| Ingredients | Amount (parts) |
|---|---|
| Liquid polybutadiene rubber*1 | 50 |
| 1,6-Hexanediol diacrylate | 15 |

TABLE 11-continued

| Ingredients | Amount (parts) |
|---|---|
| Benzoin dimethyl ether | 1 |
| Methylhydroquinone | 0.02 |

*1Nisso PB, B-1000 supplied by Nippon Soda Co.

EXAMPLE 5b

By the same procedures as those described in Example 5a, a photosensitive rubber plate was made wherein the copolymers shown in Table 12 was used instead of the copolymer plus SBS block copolymer with all other conditions remaining the same, and the properties of the rubber plate were evaluated. The results are shown in Table 13.

TABLE 12

| Ingredients | Amount (parts) |
|---|---|
| Same copolymer as used in Example 5a | 65 |
| SBS block copolymer*1 | 25 |
| SIS block copolymer*2 | 10 |
| 2,6-di-t-butyl-p-cresol | 0.2 |

*1Styrene-butadiene-styrene block copolymer, Cariflex TR1116 supplied by Shell Chem. Co.
*2Styrene-isoprene-styrene block copolymer, Kraton TR1107

EXAMPLES 5c TO 5e AND COMPARATIVE EXAMPLES 5a, 5b

By the same procedures as those described in Example 5a, photosensitive compositions were made wherein the composition and the die temperature were changed as shown in Table 13 with all other conditions remaining the same, and the properties of the photosensitive compositions were evaluated. The results are shown in Table 13.

EXAMPLE 5f

The ingredients shown in Table 2 were kneaded together at 150° C. by using a kneader. When the mixture became uniform, the kneading temperature was cooled to 120° C., and the ingredients shown in Table 3 were added to the uniform mixture wherein 1,6-hexanediol diacrylate was used instead of 1,6-hexanediol dimethacrylate. Kneading was further continued to yield a photosensitive composition.

The thus-obtained photosensitive composition was sandwiched between two polyethylene terephthalate film substrates each having a thickness of 0.1 mm, and press-formed into a photosensitive rubber plate having a thickness of 3 mm by using a vacuum press. The properties of the photosensitive rubber plate were evaluated. The results are shown in Table 13.

EXAMPLE 5g

The ingredients shown in Table 2 were dissolved in a mixed solvent of trichloroethane/toluene (40/60 by weight) to obtain a solution having a 30% concentration. To this solution, the ingredients shown in Table 3 were added wherein 1,6-hexanediol diacrylate was used instead of 1,6-hexanediol dimethacrylate, and the mixture was stirred to obtain a uniform solution.

sheet having a precisely controlled thickness and a smooth surface can be obtained. The printing sheet also exhibits a good reproduction of original image. Especially when the die temperature is not higher than 140° C., these beneficial properties are more conspicuously manifested.

In Table 13, SBS, SIS and SBR are the same as those occurring in Table 4.

TABLE 13

|  | Examples |  |  |  |  |  |  | Comparative Examples |  |
|---|---|---|---|---|---|---|---|---|---|
|  | 5a | 5b | 5c | 5d | 5e | 5f | 5g | 5a | 5b |
| Composition |  |  |  |  |  |  |  |  |  |
| Copolymer | 65 | 65 | 65 | 65 | 65 | 65 | 65 | — | 30 |
| SBS *1 | 35 | 25 | 35 | — | 35 | 35 | 35 | 100 | 70 |
| SIS *2 | — | 10 | — | 35 | — | — | — | — | — |
| SBR *3 | — | — | — | — | — | — | — | — | — |
| Kneading and sheet-formation | Extruder ↓ Die ↓ Calender | Extruder ↓ Die ↓ Calender | Extruder ↓ Die ↓ Calender | Extruder ↓ Die ↓ Calender | Extruder ↓ Die ↓ Calender | Kneader ↓ Roll ↓ Press | Dissolution in solvent ↓ Casting and drying ↓ Press | Extruder ↓ Die ↓ Calender | Extruder ↓ Die ↓ Calender |
| Shaped state |  |  |  |  |  |  |  |  |  |
| Die temperature (%) | 120 | 120 | 140 | 120 | 160 | — | — | 120 | 120 |
| Presence of bubbles | A | A | A | A | A | A | B | A | A |
| Turbidity of sheet | A | A | A | A | B | A | B | A | A |
| Theckness precisior |  |  |  |  |  |  |  |  |  |
| Plate thickness (mm) | 3.01 | 3.03 | 3.02 | 3.04 | 3.04 | 3.04 | 3.08 | 3.08 | 3.04 |
| Range (R) (mm) | 0.016 | 0.017 | 0.014 | 0.021 | 0.052 | 0.052 | 0.108 | 0.070 | 0.042 |
| Flatness and smoothnes |  |  |  |  |  |  |  |  |  |
| warpage of sheet | A | A | A | A | B | B | B | B | B |
| Surface roughness of sheet | A | A | A | A | B | B | B | B | B |
| Physical properties |  |  |  |  |  |  |  |  |  |
| Solubility in developing solution | 12.5 | 9.8 | 14.0 | 11.8 | 25.0 | 12.0 | 11.8 | Insoluble | 28.0 |
| Reproduction of protruding fine line | A | A | A | A | B | A | A | ND | C |
| Reproduction of reverse fine line | A | A | A | A | B | A | A | ND | C |

A small amount of the thus-obtained solution was cast in an open mold composed of a polyethylene terephthalate substrate having a thickness of 0.1 mm and a dam having a height of 3.0 mm, and the cast solution was dried. The procedure of casting and drying was repeated until the thickness of the thus-cast sheet reached to a predetermined value whereby a photosensitive rubber plate was obtained. The properties of the photosensitive rubber plate were evaluated. The results are shown in Table 13.

As seen from Table 13, flexographic printing plates having an improved developability with an aqueous alkali developing solution and exhibiting an excellent resolving power can be obtained from the photosensitive compositions of the present invention. In contrast, when photosensitive compositions not satisfying the specific composition of the present invention are used, the compositions cannot be developed with an aqueous alkali solution or, even though the compositions can be developed therewith, the resulting flexographic printing plates have a very poor resolving power.

Where the photosensitive composition of the present invention is formed into a sheet by using a die, a printing

REFERENCE EXAMPLE 4

An autoclave having an inner volume of 10 liters was charged with the monomers and other ingredients shown in Table 14, and the monomers were polymerized at 50° C.

TABLE 14

| Monomers and other ingredients | Amount (parts) |
|---|---|
| Butadiene | 50 |
| Butyl acrylate | 35 |
| 2-Methacryloxyethyl phosphate | 15 |
| Sodium dodecylbenzenesulfonate | 2 |
| Potassium persulfate | 0.3 |
| t-Dodecyl mercaptan | 0.4 |
| Water | 200 |

When the conversion of the monomers reached 95%, a stopper was added to stop the polymerization, and the polymerization mixture was cooled with water to obtain a polymer emulsion prepared by emulsion polymerization.

A coagulating solution was prepared by dissolving 7 parts of N-mono(polyoxyethylene)dodecylamine in 1,000 parts of water. To the coagulating solution, 300 parts of the above-mentioned polymer emulsion was slowly added and the mixture was stirred for about 2 minutes whereby the polymer emulsion was coagulated. The thus-obtained crumbs were recovered and dried at 70° C. for 4 hours to give a hydrophilic copolymer.

EXAMPLE 6a

A mixture of 100 g of the copolymer prepared in Reference Example 4, 30 g of the SBS block copolymer used in Example 1a, 20 g of nonaethylene glycol diacrylate and 20 g of nonaethylene glycol dimethacrylate as photopolymerizable unsaturated monomers, 1.5 g of benzoin methyl ether as a photopolymerization initiator, and 0.2 g of hydroquinone as a preservative stabilizer was kneaded at 80° C. for 10 minutes together in a Brabender having an inner volume of 200 ml whereby a photosensitive composition was obtained.

The photosensitive composition was sandwiched between two polyethylene terephthalate films each having a thickness of 0.1 mm, and formed into a rubber plate having a thickness of 3 mm by using a vacuum press. The photosensitive composition was kept in a solid state and had good handling properties.

A polyethylene terephthalate film on one side of the rubber plate was released, and a negative film having an optical density of 3.8 was closely adhered on the thus-exposed surface of the photosensitive layer. The negative film-adhered surface was exposed to ultraviolet rays with a wavelength of 320 to 400 nm at an irradiation intensity of 5 mW/cm$^2$ for 5 minutes by using a commercially available UV-exposing apparatus for a photosensitive resin. The UV-exposed rubber plate was developed with an aqueous 1% sodium hydroxide solution as a developing solution whereby the photosensitive composition in the UV-unexposed areas was dissolved and removed. The thus-made flexographic printing plate had an original image with a high fidelity. The printing plate had a rubbery elasticity and a hardness (Shore A) of 55 as measured at 20° C. When flexographic printing was conducted, prints having an original image with a high fidelity could be obtained.

The properties of the copolymer, the photosensitive composition and the flexographic printing plate are shown in Table 15.

EXAMPLES 6b TO 6f AND COMPARATIVE EXAMPLES 6a TO 6c

By the same procedures as those described in Reference Example 4, hydrophilic copolymers were prepared wherein the coagulants shown in Table 15 were used with all other conditions remaining the same. By the same procedures as those described in Example 6a, photosensitive compositions were prepared, and flexographic printing plates were made therefrom and their properties were evaluated. The results are shown in Table 15.

TABLE 15

|  | Examples | | | | | | Comparative Examples | | |
| --- | --- | --- | --- | --- | --- | --- | --- | --- | --- |
|  | 6a | 6b | 6c | 6d | 6e | 6f | 6a | 6b | 6c |
| Kind of coagulant | 1 | 2 | 3 | 4 | 5 | 6 | 7 | 8 | 9 |
| Properties | | | | | | | | | |
| Processability | A | A | A | B | B | B | C | C | C |
| Rubbery elasticity | A | A | A | B | B | B | ND | ND | ND |
| Solubility in aq. alkali (min) | 6.1 | 6.3 | 5.8 | 7.7 | 9.0 | 9.2 | ND | ND | ND |
| Hardness (Shore A) | 55 | 47 | 49 | 59 | 56 | 61 | ND | ND | ND |
| Reproduction of protruding fine line | A | A | A | B | B | B | ND | ND | ND |
| Reproduction of reverse fine line | A | A | A | B | B | B | ND | ND | ND |

Coagulants:
1 N-Mono(polyoxyethylene)dodecylamine
2 N,N-Bis(polyoxyethylene)dodecylamine
3 N,N-Bis(polyoxyethylene)octadecylamine
4 Lauryltrimethylammonium chloride
5 Stearyltrimethylammonium chloride
6 N,N-Dimethyllaurylamine
7 Magnesium sulfate
8 Calcium chloride
9 Aluminum sulfate

EXAMPLES 6g, 6h AND COMPARATIVE EXAMPLE 6d

By the same procedures as those described in Reference Example 4, hydrophilic copolymers were prepared wherein 34.6 parts of ethyl acrylate and 0.4 part of ethylene glycol dimethacrylate were used instead of 35 parts of butyl acrylate and the coagulants shown in Table 16 were used all other conditions remaining the same. By the same procedures as those described in Example 6a, photosensitive compositions were prepared, and flexographic printing plates were made therefrom and their properties were evaluated. The results are shown in Table 16.

TABLE 16

|  | Examples | | Co. Ex. |
| --- | --- | --- | --- |
|  | 6g | 6h | 6d |
| Coagulant | 2 | 3 | 9 |
| Properties | | | |
| Processability | A | A | C |
| Rubbery Elasticity | A | A | ND |

TABLE 16-continued

| | Examples | | Co. Ex. |
|---|---|---|---|
| | 6g | 6h | 6d |
| Solubility in aq. alkali (min) | 6.1 | 5.9 | ND |
| Hardness (Shore A) | 48 | 51 | ND |
| Reproduction of protruding fine line | A | A | ND |
| Reproduction of reverse fine line | A | A | ND |

As seen from Tables 15 and 16, the photosensitive compositions made in Examples 6a to 6h exhibited an enhanced handling property, a good developability with an aqueous alkali developing solution and a good water resistance and resulted in cured products having an enhanced hardness, and therefore, are valuable as a water-soluble material for a photosensitive rubber plate.

In contrast, the copolymers made by using a metal salt as a coagulant in Comparative Examples 6a to 6d had a poor hydrophilic property and could not be kneaded together with the other ingredients for preparation of photosensitive compositions. Therefore the evaluation of photosensitive compositions and flexographic printing plates could not be conducted.

Industrial Applicability

The photosensitive composition of the present invention have good photosensitivity, processability and solubility in an aqueous alkali solution. An exposed and cured product of the photosensitive composition exhibits enhanced resistance to an aqueous ink, transparency, strength and rubbery elasticity at a low temperature, and thus, is useful as a material for a photosensitive rubber plate capable of being developed with an aqueous alkali developing solution.

The photosensitive composition of the present invention has a high sensitivity and thus the exposure time can be shortened, and has a good solubility in an aqueous alkali developing solution and thus the development can be completed in 5 to 10 minutes. Further, the as-developed rubber plate can be used as immediately after drying, for printing, and thus, the rubber plate is useful for a flexographic printing plate. The flexographic printing plate can be made by a process simpler than that for the conventional flexographic printing plates, and the operating time for making the printing plate can be shortened to a considerable extent.

Where a covering material layer is formed on the photosensitive composition layer, the undesirable sticking of the photosensitive composition layer to a negative film of original image can be avoided, and the adhered negative film can be easily released and thus can be reused.

The flexographic printing plate of the present invention can be used for flexographic printing using a flexographic ink of an organic solvent type. It has a good resistance to an aqueous ink and therefore it also is suitable for flexographic printing using an aqueous flexographic ink which is advantageous in that it does not cause air pollution.

We claim:
1. A photosensitive composition comprising:
(A) 35 to 80 parts by weight of a phosphorus-containing hydrophilic copolymer represented by the following formula (3):

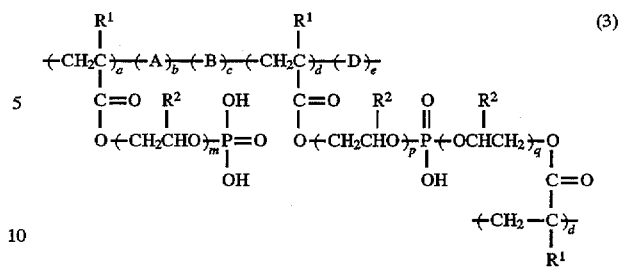

wherein A is a conjugated diene unit, B is a monoolefinically unsaturated monomer unit, D is a monomer having at least two polymerizable unsaturated bonds, each of $R^1$ independently represent a hydrogen atom or a methyl group, $R^2$ independently represent a hydrogen atom or a substituted or unsubstituted alkyl group having 1 to 3 carbon atoms, m, p and q independently represent an integer of 1 to 23, and a, b, c, d and e of the respective recurring units satisfy the following ratios, which are by weight:
a/(a+d+b+c+e)=0 to 0.30
d/(a+d+b+c+e)=0 to 0.30
(a+d)/(a+d+b+c+e)=0.05 to 0.30
b/(a+d+b+c+e)=0.40 to 0.90
c/(a+d+b+c+e)=0 to 0.50
e/(a+d+b+c+e)=0 to 0.10
(B) 65 to 20 parts by weight of thermoplastic elastomer; the sum of (A) plus (B) being 100 parts by weight;
(C) 5 to 300 parts by weight, based on 100 parts by weight of the total of (A) plus (B), of a photopolymerizable ethylenically unsaturated monomer; and
(D) 0.1 to 10 parts by weight, based on 100 parts by weight of the total of (A) plus (B), of a photopolymerization initiator.

2. A photosensitive composition according to claim 1, wherein a, b, c, d and e in the formula (3) representing the ingredient (A) satisfy the following ratios:
a/(a+d+b+c+e)=0 to 0.20
d/(a+d+b+c+e)=0 to 0.20
(a+d)/(a+d+b+c+e)=0.05 to 0.20
b/(a+d+b+c+e)=0.50 to 0.80
e/(a+d+b+c+e)=0.10 to 0.40
e/(a+d+b+c+e)=0 to 0.10.

3. A photosensitive composition according to claim 1, wherein the ingredient (A) is made by coagulating an emulsion of the copolymer, as-obtained by copolymerization, with a coagulant selected from the group consisting of a tertiary amine, a quaternary ammonium salt and an amine compound represented by the following formula (2):

wherein $R^3$ is a hydrocarbon group, $R^4$ and $R^5$ independently represent divalent hydrocarbon radicals, r and s are integers of 1 to 60, and t is 0 or 1.

4. A photosensitive composition according to claim 1, wherein the thermoplastic elastomer (ingredient (B)) is a thermoplastic elastomeric block copolymer.

5. A photosensitive composition according to claim 4, wherein the thermoplastic elastomeric block copolymer comprises a thermoplastic non-elastomeric polymer block and an elastomer block.

6. A photosensitive composition according to claim 1, wherein the amounts of ingredient (A), ingredient (B), ingredient (C) and ingredient (D) are 40 to 70 parts by weight, 60 to 30 parts by weight, 10 to 200 parts by weight and 1 to 5 parts by weight, respectively.

7. A photosensitive rubber plate which is a laminated product comprising a substrate and a layer of a photosensitive composition formed on the major surface of the substrate; said photosensitive composition being described in claim 1.

8. A photosensitive rubber plate according to claim 7, wherein said laminated product further comprises a covering material layer composed of a water-soluble polymer, which is formed on the photosensitive composition layer.

9. A photosensitive rubber plate according to claim 8, wherein said water-soluble polymer is selected from the group consisting of polyvinyl alcohol, polyvinyl pyrrolidone, polyacrylic acid, polyacrylamide, polyethylene oxide, and polyethyleneimine.

10. A photosensitive rubber plate according to claim 8, wherein said water-soluble polymer is polyvinyl alcohol.

11. A photosensitive rubber plate according to claim 10, wherein said polyvinyl alcohol has a saponification degree of 60 to 100% by mole.

12. A photosensitive rubber plate according to claim 10, wherein said polyvinyl alcohol has a saponification degree of 65 to 80% by mole and a viscosity of not more than 10 cp as measured at a temperature of 20° C. by a Höppler viscometer.

13. A process for making a flexographic printing plate comprising the steps of:

image-wise exposing to light a photosensitive rubber plate described in claim 7, and removing the photosensitive composition in light-unexposed areas of the rubber plate by using an aqueous developing solution.

14. A process for making a flexographic printing plate according to claim 13, wherein the aqueous developing solution is selected from the group consisting of (1) aqueous solutions of an anionic surface active agent and (2) aqueous solutions of a nonionic surface active agent.

15. A process for making a flexographic printing plate according to claim 14, wherein the nonionic surface active agent is an aliphatic alkanol amide.

16. A flexographic printing plate made by a process described in any of claim 13.

17. A process for making a photosensitive rubber plate which comprises the steps of:

kneading a photosensitive composition described in claim 1, extruding the kneaded composition through a die, and calendering the extruded composition to form a sheet laminated on a substrate.

18. A photosensitive composition comprising:

(A) 35 to 80 parts by weight of a phosphorus-containing hydrophilic copolymer made by copolymerization of a mixture of:

(a) 5 to 30% by weight of a phosphate ester group containing unsaturated monomer, (b) 40 to 90% by weight of a conjugated diene monomer, (c) 0 to 50% by weight of other monoolefinically unsaturated monomer, and (d) 0 to 10% by weight of a polyfunctional vinyl monomer;

(B) 65 to 20 parts by weight of thermoplastic elastomer; the sum of (A) plus (B) being 100 parts by weight;

(C) 5 to 300 parts by weight, based on 100 parts by weight of the total of (A) plus (B), of a photopolymerizable ethylenically unsaturated monomer; and (D) 0.1 to 10 parts by weight, based on 100 parts by weight of the total of (A) plus (B), of a photopolymerization initiator.

19. The photosensitive composition according to claim 18, wherein the ingredient (A) is a phosphorus-containing hydrophilic copolymer made by copolymerization of a mixture of:

(a) 5 to 20% by weight of a phosphate ester group-containing unsaturated monomer, (b) 50 to 80% by weight of a conjugated diene monomer, and (c) 10 to 40% by weight of other monoolefinically unsaturated monomer.

20. A photosensitive composition according to claim 18, wherein the ingredient (A) is made by a process comprising the steps of:

copolymerizing a mixture of:

(a) 5 to 30% by weight of a phosphate ester group-containing unsaturated monomer, (b) 40 to 90% by weight of a conjugated diene monomer, (c) 0 to 50% by weight of other monoolefinically unsaturated monomer, and (d) 0 to 10% by weight of a polyfunctional vinyl monomer, to give an emulsion of a phosphorus-containing hydrophilic copolymer, and coagulating the copolymer emulsion with a coagulant selected from the group consisting of a tertiary amine, a quaternary ammonium salt and an amine compound represented by the formula (2):

wherein $R^3$ is a hydrocarbon group, $R^4$ and $R^5$ independently represent divalent hydrocarbon radicals, r and s are integers of 1 to 60, and t is 0 or 1.